(12) United States Patent
Jones et al.

(10) Patent No.: US 6,368,192 B1
(45) Date of Patent: Apr. 9, 2002

(54) WAFER PREPARATION APPARATUS INCLUDING VARIABLE HEIGHT WAFER DRIVE ASSEMBLY

(75) Inventors: Oliver David Jones, Watsonville; David T. Frost, San Jose; John G. Dewit, Scotts Valley, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/540,975

(22) Filed: Mar. 31, 2000

(51) Int. Cl.⁷ ................................................ B24B 7/00
(52) U.S. Cl. ......................................... 451/66; 451/209
(58) Field of Search ............................. 451/66, 57, 60, 451/63, 59, 209, 210, 194; 414/936, 937, 938, 939, 940, 941

(56) References Cited

U.S. PATENT DOCUMENTS

| | | | |
|---|---|---|---|
| 4,208,760 A | | 6/1980 | Dexter et al. |
| 5,486,134 A | * | 1/1996 | Jones et al. ................ 451/209 |
| 5,906,687 A | | 5/1999 | Masui et al. |
| 5,924,154 A | | 7/1999 | Gockel et al. |
| 5,933,902 A | * | 8/1999 | Frey ............................ 15/102 |
| 6,033,522 A | * | 3/2000 | Iwata et al. ................. 156/345 |
| 6,070,284 A | * | 6/2000 | Garcia et al. ................ 15/102 |

FOREIGN PATENT DOCUMENTS

| | | |
|---|---|---|
| EP | 0 526 245 A | 2/1993 |
| EP | 0 718 871 A | 6/1996 |
| WO | WO 99/40611 | 8/1999 |

* cited by examiner

Primary Examiner—Timothy V. Eley
Assistant Examiner—Dung Van Nguyen
(74) Attorney, Agent, or Firm—Martine & Penilla, LLP

(57) ABSTRACT

An apparatus for preparing a semiconductor wafer is provided. The apparatus includes a wafer drive assembly having a pair of wafer drive rollers for rotating a semiconductor wafer in a vertical orientation. The wafer drive assembly is configured such that the wafer drive rollers are controllably movable from a first position to a second position. Also provided as part of the apparatus is a pair of wafer preparation assemblies movably disposed in an opposing relationship above the wafer drive assembly. Each of the wafer preparation assemblies has a first wafer preparation member and a second wafer preparation member. The wafer preparation assemblies being movable into a first position in which each of the first wafer preparation members is position to perform a first wafer preparation operation on the wafer and into a second position in which each of the second wafer preparation members is positioned to perform a second wafer preparation operation on the wafer.

19 Claims, 16 Drawing Sheets

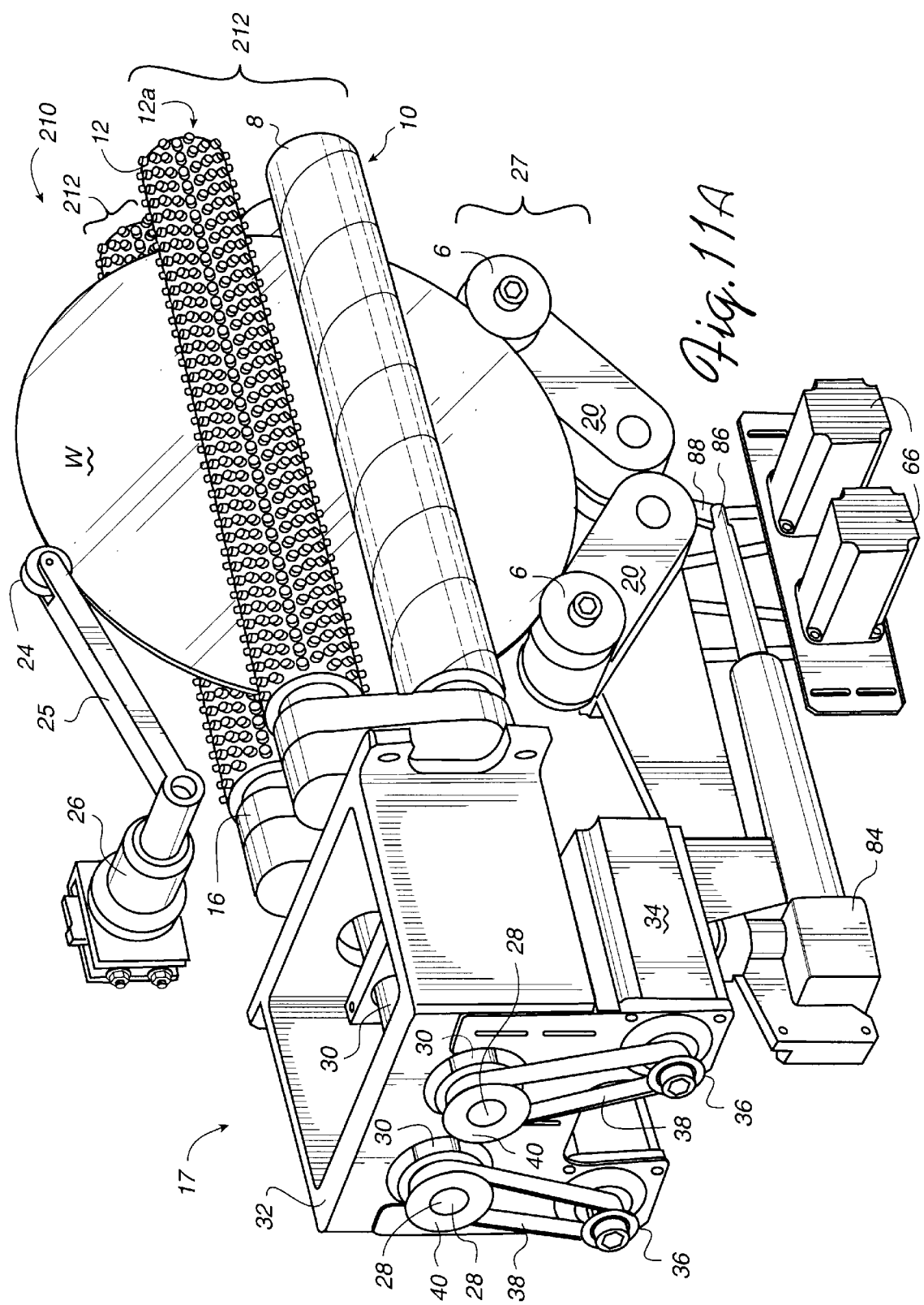

WAFER PREPARATION APPARATUS INCLUDING VARIABLE HEIGHT WAFER DRIVE ASSEMBLY

BACKGROUND OF THE INVENTION

The present invention relates generally to semiconductor fabrication and, more particularly, to methods for preparing semiconductor wafers in which preparation operations are performed on a vertically oriented wafer. The preparation is configured to take place in a single enclosure apparatus.

In the fabrication of semiconductor devices, a variety of wafer preparation operations are performed. By way of example, these wafer preparation operations include cleaning operations and polishing/planarization operations, e.g., chemical mechanical planarization (CMP). One known polishing/planarization technique uses platens with planetary polishing motion. One disadvantage of this technique is that it requires multi-step procedures, which are time-consuming and relatively expensive. Another disadvantage of this technique is that it tends to produce wafers having surfaces that suffer from a relatively high degree of topographic variations.

Another known polishing/planarization technique involves circumferential polishing. In one known circumferential polishing system, a wafer is rotated in a vertical orientation by wafer drive rollers. As the wafer is rotated, a pair of cylindrical polishing pads is brought into contact with the opposing surfaces of the wafer. The polishing pads are mounted on counter-rotating mandrels disposed on opposite sides of the wafer being processed. The mandrels span across the diameter of the wafer so as to pass over the wafer center. The rotation of the mandrels causes a rotary pad motion perpendicular to the wafer diameter in a circumferential direction. During the polishing operation, nozzles direct sprays of liquid, e.g., an abrasive slurry, a chemical solution, or a rinse solution, on the opposing surfaces of the wafer.

One drawback of this known circumferential polishing system is that it provides only circumferential polishing motion. As such, the relative velocity of each pad is not uniform across each wafer surface, with the velocity near the wafer edge being greater than the velocity near the wafer center. This is problematic because it not only results in the creation of circumferential residual scratches on each of wafer surfaces, but also results in a more wafer material being removed from the center portion of the wafer than near the perimeter due to the greater dwell time experienced by the center portion of the wafer. As a consequence of this nonuniform material removal rate, each of the opposing surfaces of the wafer tends to have a flared contour, i.e., a contour in which the central portion is depressed relative to the edge portions. As the semiconductor industry moves toward the use of smaller, e.g., 0.18 μm and smaller, feature sizes, such flared contours are undesirable.

In view of the foregoing, there is a need for a method and apparatus for circumferential wafer preparation that minimizes the creation of circumferential residual scratches, provides processed wafers have desired surface contours, and enables multiple wafer preparation operations to be performed on a wafer without moving the wafer between stations.

SUMMARY OF THE INVENTION

Broadly speaking, the present invention fills this need by providing apparatus or preparing wafers.

In accordance with one aspect of the present invention, an apparatus for preparing a semiconductor wafer is disclosed.

The apparatus includes a frame member having first and second coaxial shaft assemblies extending therethrough. Each of the coaxial shaft assemblies including an inner transfer shaft and a hollow outer pivot shaft, each of the outer pivot shafts having a gear ring affixed thereto, and the gear rings intermeshing at an approximate midpoint between the outer pivot shafts. The apparatus further includes a first roller arm having a first end and a second end. The first end is coupled to one end of the hollow outer pivot shaft of the first coaxial shaft assembly and has one end of the inner transfer shaft of the first coaxial shaft assembly disposed therein. The second end has a first drive roller shaft disposed therein, and the first drive roller shaft is rotatably coupled to the end of the inner transfer shaft of the first coaxial shaft assembly disposed in the first end of the first roller arm. The apparatus further including a first wafer drive roller rotatably mounted on the first drive roller shaft. The first wafer drive roller is oriented to rotate a semiconductor wafer in a vertical orientation. A second roller arm has a first end and a second end. The first end is coupled to one end of the hollow outer pivot shaft of the second coaxial shaft assembly and has one end of the inner transfer shaft of the second coaxial shaft assembly disposed therein. The second end has a second drive roller shaft disposed therein, and the second drive roller shaft is rotatably coupled to the end of the inner transfer shaft of the second coaxial shaft assembly disposed in the first end of the second roller arm. A second wafer drive roller is rotatably mounted on the second drive roller shaft, and the second wafer drive roller is oriented to rotate a semiconductor wafer in a vertical orientation. A drive belt is further provided for rotating at least one of the inner transfer shafts of the first and second coaxial shaft assemblies. The apparatus also includes an actuator for controllably moving a lever arm fixed to one of the gear rings, such that movement of the lever arm causes the first and second roller arms to move from a first position to a second position.

In accordance with another aspect of the present invention, an apparatus for preparing a semiconductor wafer is disclosed. The apparatus includes a first wafer drive roller rotatably disposed on a first roller arm, and the first wafer drive roller being oriented to rotate a semiconductor wafer in a vertical orientation. The apparatus also includes a second wafer drive roller rotatably disposed on a second roller arm. The second wafer drive roller is oriented to rotate a semiconductor wafer in a vertical orientation. Each of the first and second roller arms is configured to transmit rotational power to the wafer drive roller disposed thereon, and each of the first and second roller arms is pivotable between a first position and a second position to adjust a height of the wafer drive roller disposed thereon.

In yet another aspect of the invention, an apparatus for preparing a semiconductor wafer is disclosed. The apparatus includes a wafer drive assembly having a pair of wafer drive rollers for rotating a semiconductor wafer in a vertical orientation. The wafer drive assembly is configured such that the wafer drive rollers are controllably movable from a first position to a second position. Also provided as part of the apparatus is a pair of wafer preparation assemblies movably disposed in an opposing relationship above the wafer drive assembly. Each of the wafer preparation assemblies has a first wafer preparation member and a second wafer preparation member. The wafer preparation assemblies being movable into a first position in which each of the first wafer preparation members is position to perform a first wafer preparation operation on the wafer and into a second position in which each of the second wafer preparation members is positioned to perform a second wafer preparation operation on the wafer.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of his specification, illustrate exemplary embodiments of the invention and together with the description serve to explain the principles of the invention.

FIGS. 11A and 11B illustrate in greater detail the wafer preparation apparatus in accordance with one embodiment of the invention.

DETAILED DESCRIPTION OF THE INVENTION

Several exemplary embodiments of the invention will now be described in detail with reference to the accompanying drawings.

The following embodiments describe methods as well as apparatus that can be used in the preparation of substrates. Such substrates can include, for example, semiconductor wafers of any size, such as 200 mm wafers, 300 mm wafers (and smaller or larger wafers). In the following description, the preparation apparatus of the invention is described in connection with the preparation of wafers. It should be understood, however, that the preparation apparatus also can be used to prepare other substrates such as hard disks and the like. Preparation operations include, for example, buffing, chemical mechanical polishing (CMP), scrubbing (as is done in wafer cleaning), etching, and rinsing with fluids such as DI water. In the various examples, several methods and apparatus are disclosed that assist in achieving high precision and controlled preparation. For instance, the preparation achieved by way of the systems and apparatus enable controlled scrubbing, buffing, and polishing on desired surface locations of the substrate. That is, the substrate can be moved to different controlled locations within an enclosure to enable preparation at different surface locations and at different times. The preparation, by way of the disclosed apparatus, can also include contact with different preparation members (e.g., brushes, pads, etc.). Accordingly, the following description should be read in light of the many alternatives described herein.

Figure 1:
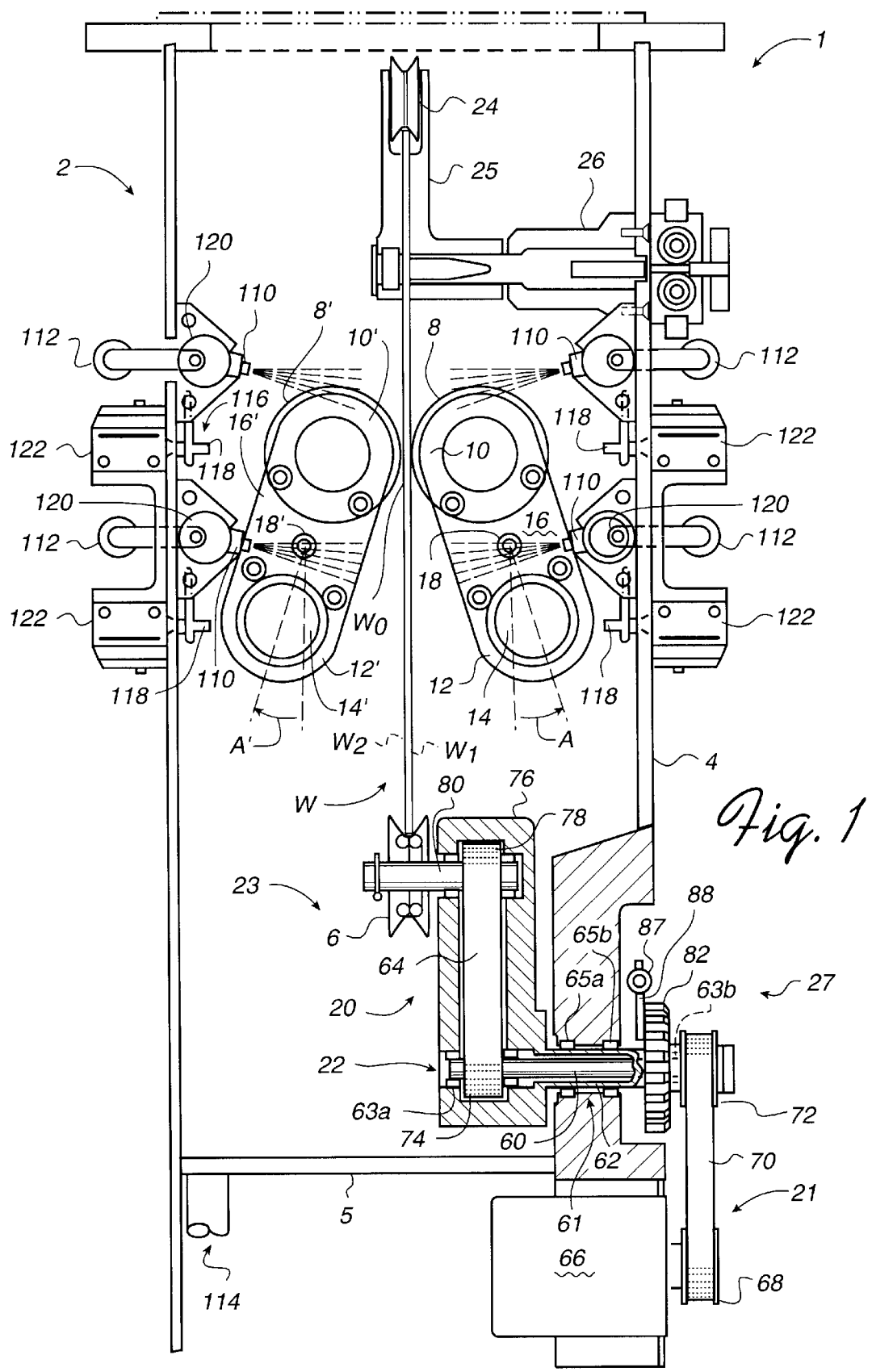
FIG. 1 is an end elevation view of a wafer preparation apparatus in accordance with one embodiment of the invention.
Figure 2:
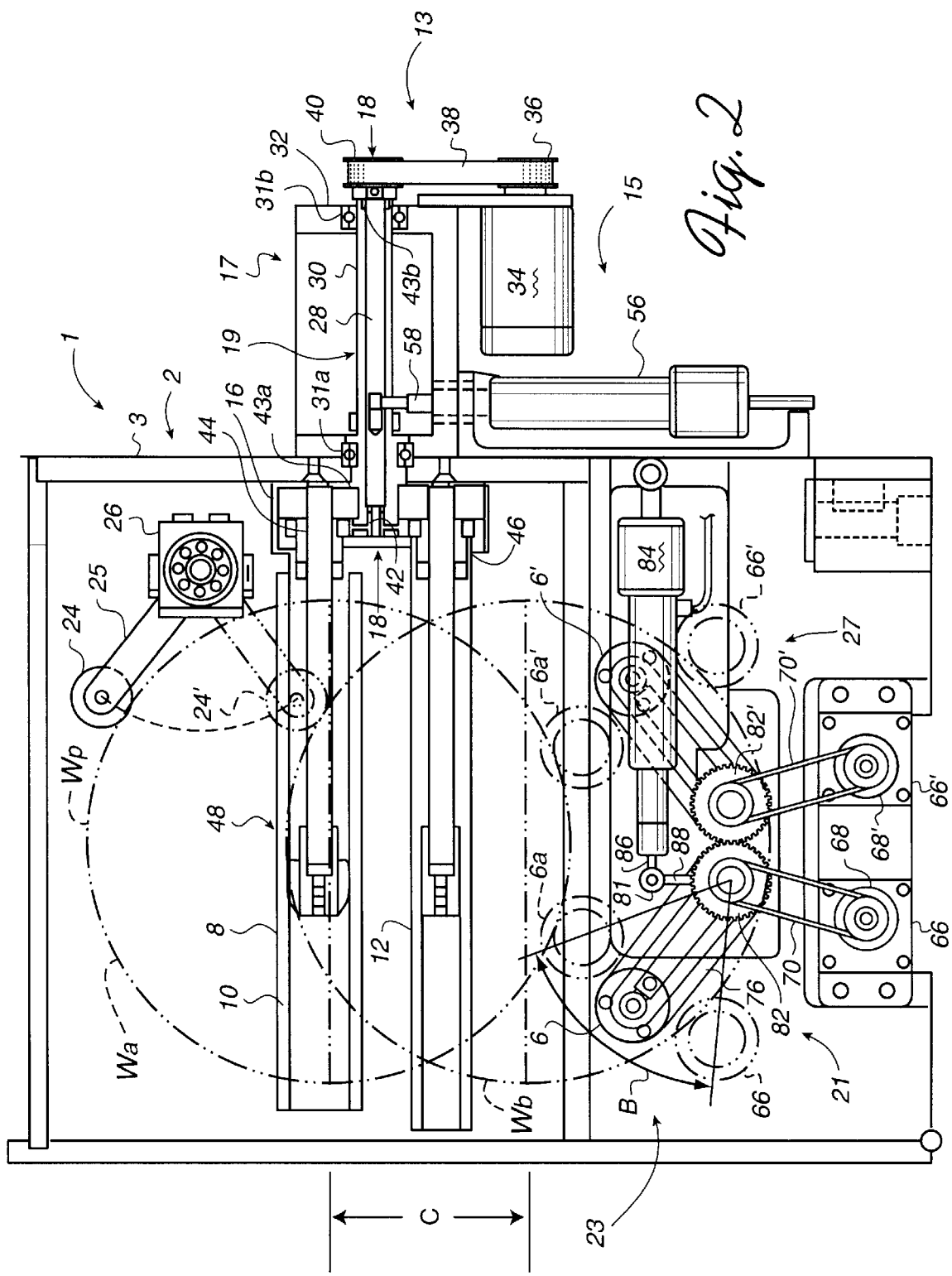
FIG. 2 is a side elevation view of the wafer preparation apparatus shown in FIG. 1 that shows the right-hand drive casing and its associated mandrels and polishing pads in cross section, and further shows a wafer (in phantom) supported by the wafer drive roller assembly.

Wafer Preparation Apparatus: FIGS. 1 and 2 are a front end cross-sectional view and a right side cross-sectional view, respectively, of a wafer preparation apparatus in accordance with one embodiment of the invention. As shown therein, wafer preparation apparatus 1 includes housing 2, which serves as a support structure for various components of the apparatus, as will be explained in more detail below. Semiconductor wafer W, which is shown edge-on in FIG. 1 and face-on (in phantom) in FIG. 2, is disposed on wafer drive rollers 6, 6' in a vertical orientation.

Figure 11B:
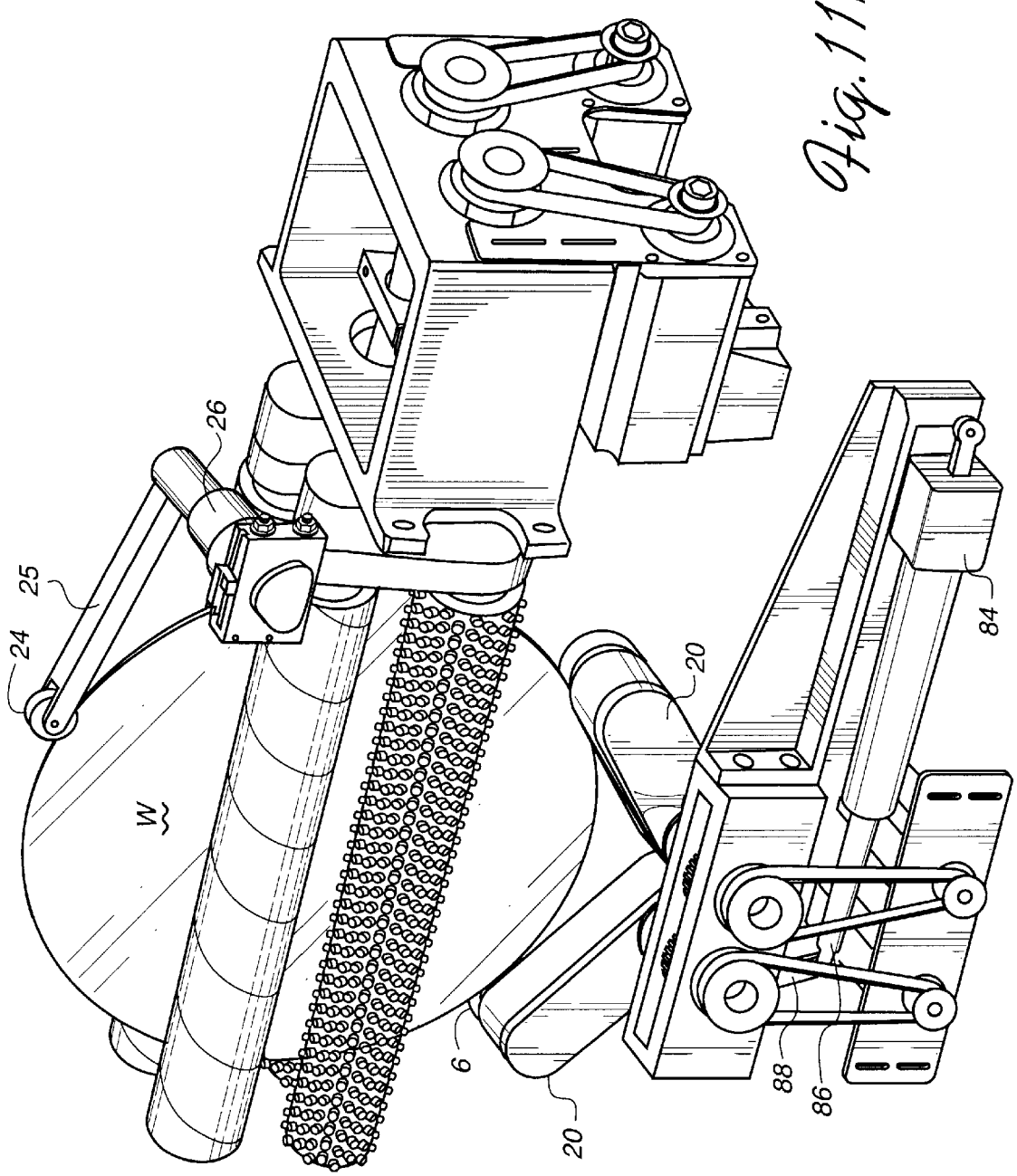

As shown in FIG. 1, wafer W is in contact with upper pair of polishing pads 8, 8', with right pad 8 contacting right wafer face W1 and left pad 8' contacting left wafer face W2. Lower polishing pads 12, 12' are disengaged from right and left wafer faces W1, W2, respectively. Wafer preparation apparatus 1 need not be bilaterally symmetrical; however, numerous assemblies and sub-assemblies are preferably disposed symmetrically in pairs to the right and left of the plane of symmetry of wafer W as supported in a vertical orientation within housing 2. For that reason the terms "right" and "left" will generally be used herein with reference to wafer W as shown in FIG. 1. Alternatively, it is possible to have a pair of brushes 12b as well as a pair of pads as shown in FIGS. 11A and 11B. In the example, the brushes are identified as brushes 12b and can either be mounted on a mandrel or a brush core that is connected directly to one of the gears 44 or 46.

Figure 3:
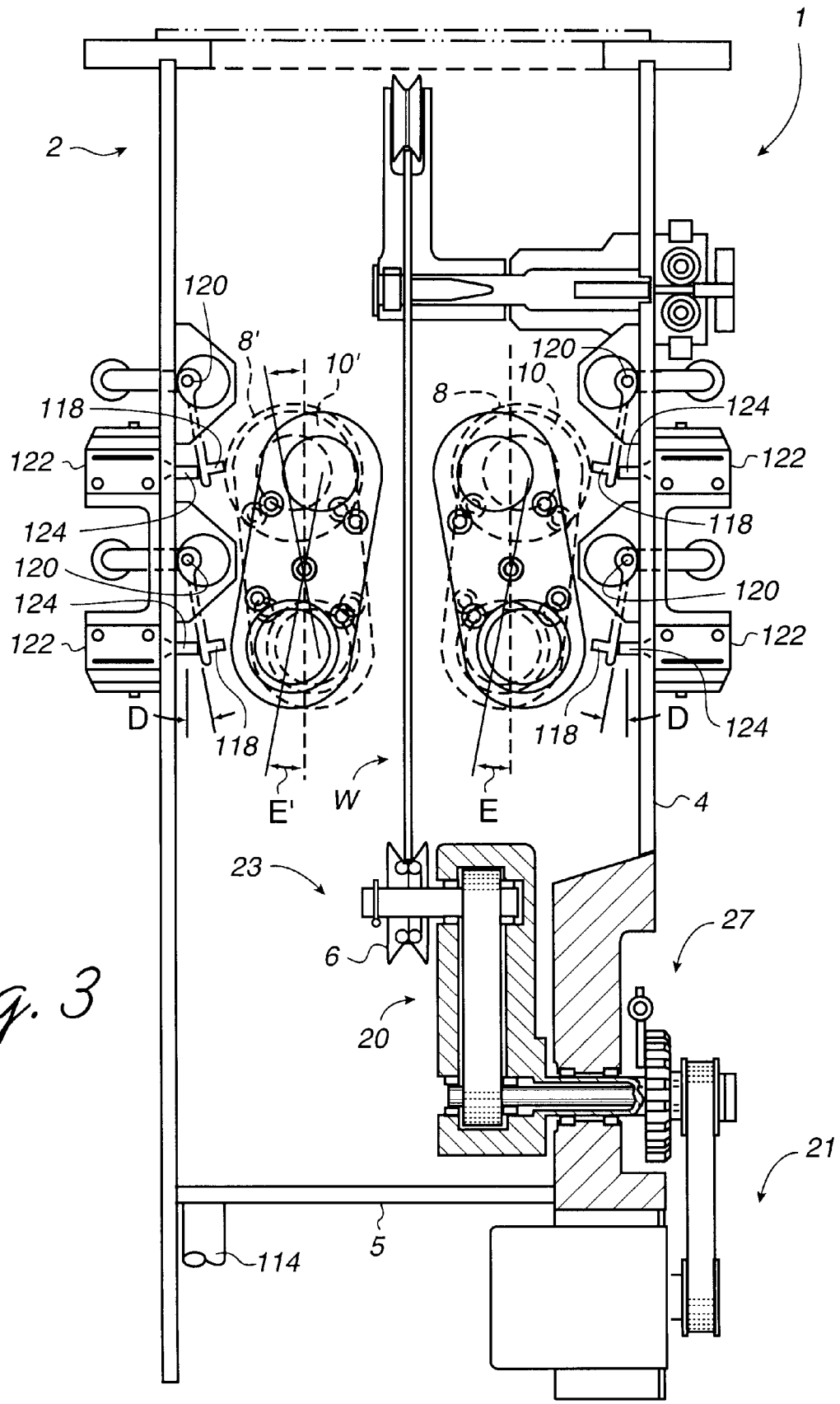
FIG. 3 is an end elevation view of the wafer preparation apparatus shown in FIG. 1 that shows the drive casings in a range of neutral positions in which the polishing pads are out of contact with a wafer and engage optional pad conditioners mounted to the walls of the housing.

As shown in FIGS. 1–3, upper polishing pads 8, 8' are mounted about the perimeter of cylindrical upper mandrels 10, 10', and the lower polishing pads 12, 12' are mounted about the perimeter of cylindrical lower mandrels 14, 14'. The upper and lower mandrels, which are disposed horizontally, are arranged so that upper mandrel 10 and lower mandrel 14 are on the right side of wafer W and upper mandrel 10' and lower mandrel 14' are on the left side of wafer W. A selectable vertical spacing separates upper and lower mandrel pairs 10, 10' and 14, 14', respectively. In one embodiment, the upper and lower pairs are spaced apart by a fraction of the wafer radius, preferably from about one-quarter to about three-quarters of the wafer radius. One end of each of upper mandrels 10, 10' and each of lower mandrels 14, 14' is rotatably mounted within drive casings 16, 16', each of which encloses gearing that is rotatably coupled to wafer preparation drive assembly 17. Additional details of wafer preparation drive assembly 17 are set forth below under the heading "Wafer Preparation Drive Assembly." In one embodiment, wafer preparation drive assembly 17 includes both pad rotating mechanism 13 to transmit rotational torque to mandrels 10, 10' and 14, 14' and pad engagement mechanism 15, which controllably moves polishing pads 8, 8' and 12, 12' into and out of contact with wafer W.

With reference to FIG. 1, right and left drive casings 16, 16' pivot around pivot points 18, 18', each of which is located a small distance from the plane of the wafer W. When right drive casing 16 pivots to bring its upper end inward toward the plane of wafer W, upper polishing pad 8, which is mounted on mandrel 10, is moved into contact with right wafer face W1 and the lower polishing pad 12, which is mounted on mandrel 14, is moved away from right wafer face W1. On the other hand, when right drive casing 16 pivots to bring its lower end inward toward the plane of wafer W (see FIG. 3), lower polishing pad 12 is moved into contact with right wafer face W1 and upper polishing pad 8 is moved away from right wafer face W1. It will be apparent to those skilled in the art the foregoing description also applies to left drive casing 16', which may pivoted to move upper and lower polishing pads 8', 12', respectively, into contact with left wafer face W2.

Thus, pivot points 18, 18' are close enough to the plane of wafer W so that drive casings 16, 16' need only be pivoted through a moderate angle A, A' to bring upper polishing pads 8, 8' (or lower pads 12, 12' for the opposite pivot angle) into contact with wafer faces W1, W2 so that wafer W is "pinched" by the opposing polishing pads. The angle A depends on, among other things, the pad diameter. In one embodiment, the angle A is about 15° to about 25°. However, as shown in FIG. 3, pivot points 18, 18' are far enough from the plane of wafer W so that when drive casings 16, 16' are pivoted to a generally vertical position, both upper pads 8, 8' and lower pads 12, 12' assume a neutral position in which they are disengaged and out of contact with wafer W by a substantial separation.

The pivoting action of drive casings 16, 16' permits either the upper mandrel or the lower mandrel of each pair of mandrels to be separately pressed inward so that the polishing pad mounted thereon contacts one of the wafer surfaces. As such, a wafer may be subjected to two separate polishing operations within the wafer preparation apparatus: one polishing operation with the wafer "pinched" between the upper polishing pads and the other polishing operation with the wafer "pinched" between the lower polishing pads.

With continuing reference to FIGS. 1–3, wafer W is simultaneously supported and driven in rotation by wafer drive assembly 23. In one embodiment, wafer drive assembly 23 is a variable height edge drive assembly. FIG. 2 shows wafer W (in phantom) in both a raised position, Wa, and a lowered position, Wb. As stated above, wafer drive rollers 6, 6' support wafer W. In FIG. 2, wafer drive rollers 6, 6' are shown (in phantom) in corresponding raised positions 6a, 6a' and lowered positions 6b, 6b'. Wafer drive rollers 6, 6' engage the wafer perimeter edge, Wp, and are mounted to the end of roller arms 20, 20', which in turn are pivotally mounted to a frame member. The frame member may be supported on a suitable support structure, e.g., right side wall 4 of housing 2 or housing floor 5.

Variable height edge drive assembly 23 includes roller drive mechanism 21 to transmit rotational power to the drive rollers 6, 6'. Variable height edge drive assembly 23 also includes wafer translation mechanism 27 that regulates the pivotal movement of roller arms 20, 20' by pivoting the arms about pivot points 22, 22'. Roller arms 20, 20' are geared together as a pair to cause them to counter-pivot in symmetrically opposed motion. Additional details of variable height edge drive assembly 23, including additional details of roller drive mechanism 21 and wafer translation mechanism 27, are set forth below under the heading "Variable Height Edge Drive Assembly."

Wafer top alignment roller 24 is mounted on alignment arm 25, which is in turn pivotally mounted to alignment tensioner 26 mounted to the upper portion of right side wall 4. Alignment roller 24 engages the wafer perimeter edge, Wp, near the top of the wafer W, and serves both to maintain alignment of wafer W and also to provide lateral support when the polishing pads (8, 8', 12, 12') are disengaged, i.e., in the neutral position. The pivotal movement of alignment arm 25 permits top roller 24 to remain engaged and to follow the wafer perimeter, Wp, as the wafer moves upward and downward as indicated by positions Wa and Wb (see FIG. 2). In FIG. 2, the upper position of the top roller is shown as 24 and the lower position is shown (in phantom) as 24'. If desired, additional edge rollers may be used to assist in supporting, stabilizing, rotating, or loading/unloading the wafer.

Roller arms 20, 20' and drive rollers 6, 6' are shown in FIG. 2 in an intermediate angular position. A typical operational range of pivotal movement of roller arms 20, 20' is indicated by the upper and lower depictions of drive rollers 6, 6' in phantom lines, which define the pivotal range of motion as angle B. The upward motion of the roller arms 20, 20' causes drive rollers 6, 6' to move upward and closer together as a pair. This in turn causes wafer W to move upward, primarily because of the higher position of the drive rollers but also in part because the drive rollers are spaced closer together. On the other hand, downward pivoting of roller arms 20, 20' causes a corresponding lowering of wafer W. The movement of drive rollers 6, 6' through angle B causes the wafer center Wo to move up or down by a corresponding vertical travel distance indicated by double-headed arrow C (see FIG. 2). The motion of drive rollers 6, 6' may be controlled to control the vertical motion of the wafer. By way of example, the drive rollers may be pivoted inwardly and outwardly so that wafer W oscillates up and down relative to the polishing pads (8, 8' or 12,12').

As shown in FIGS. 1–3, wafer W is disposed in a substantially vertical orientation and the polishing pads are disposed in a substantially horizontal orientation. It will be apparent to those skilled in the art that wafer W may be disposed in different orientations, if desired. It will be further apparent to those skilled in the art that the polishing pads may be disposed at an angle with respect to vertical, if desired. In this case, the motion of the wafer with respect to the pads should still be generally perpendicular to the axis of the mandrels. A substantially vertical orientation of wafer W is preferred because it simplifies the various support and drive assemblies in the apparatus and facilitates the draining of polishing slurry, treatment solutions, and rinse solutions away from the polishing pads and the wafer.

Wafer Preparation Drive Assembly: Wafer preparation drive assembly 17 is shown in FIGS. 2 (cross-sectional view); 4A and 4B (elevational view as seen from outside end wall 3), and 5 (detailed cross-sectional view of drive casing and mandrel shown in FIG. 2). As shown in FIG. 2, drive casing 16 connects to dual coaxial shaft assembly 19 that extends through end wall 3. Coaxial shaft assembly 19 delivers both rotational power to the mandrels for wafer preparation via an inner shaft and delivers pivotal activation and control to the drive casing for engagement/disengagement of the pads with the wafer faces via an outer shaft. Thus, coaxial shaft assembly 19 is an integrated component of both pad rotating mechanism 13 and pad engagement mechanism 15. In one embodiment, wafer preparation drive assembly 17 includes separate coaxial shaft arrangements 19, 19' for drive casings 16, 16', respectively. The description herein with respect to the movement of right drive casing 16 is also applicable to left drive casing 16'.

Coaxial shaft assembly 19 includes inner transfer shaft 28 and hollow outer pivot shaft 30. Transfer shaft 28 transmits rotational power to the mandrels (10, 10', 14, 14') and is journaled to bearings 43a and 43b, which are mounted on the inside of outer pivot shaft 30 adjacent to each end thereof. Outer pivot shaft 30 is in turn journaled to wafer preparation drive assembly mounting frame 32 by bearings 31a and 31b and provides pivoting control of drive casings 16, 16' so that one of the pairs of the polishing pads (8, 8' or 12, 12') may be brought into contact with wafer W.

Figures 4A, 4B:
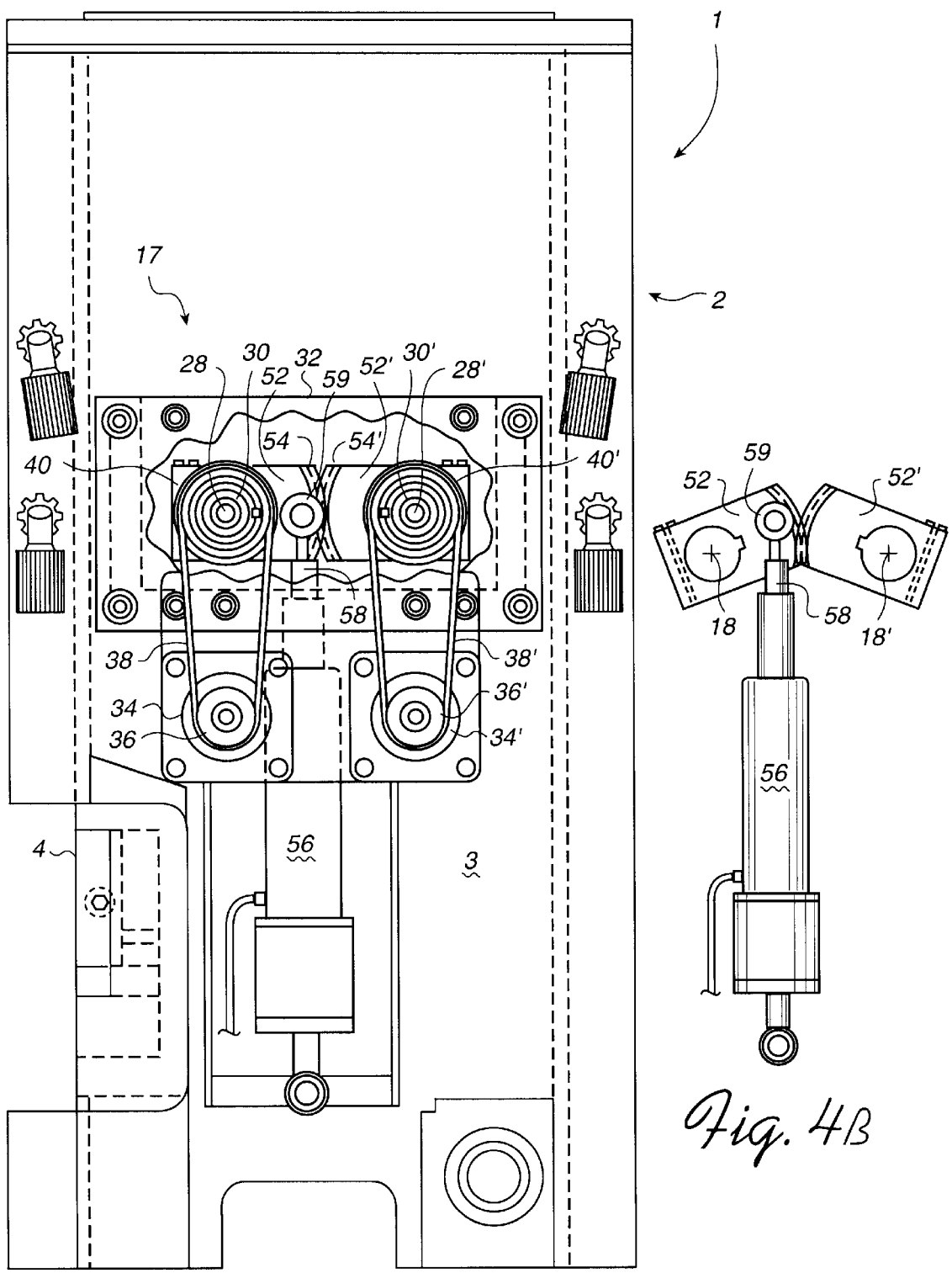
FIG. 4A is an elevation view of the wafer preparation apparatus shown in FIG. 1 that shows the wafer preparation drive assembly, the levers for pivoting the wafer preparation assemblies, and the linear actuator for pivoting the pivot levers, all of which are disposed outside of the housing.
FIG. 4B is a more detailed view of the levers and the linear actuator shown in FIG. 4A in which the actuator rod is shown in its upward, extended position.

As shown in FIGS. 2 and 4A, pad rotating mechanism 13 includes left and right wafer preparation motors 34, 34', drive pulleys 36, 36', belts 38, 38', and shaft pulleys 40, 40'. Drive pulleys 36, 36' are rotatably mounted on motors 34, 34', respectively, which are mounted beneath frame 32. Belts 38, 38' are disposed on drive pulleys 36, 36' and shaft pulleys 40, 40', which are mounted on the ends of transfer shafts 28, 28', respectively, that extend outside of frame 32. As shown in FIGS. 2 and 5, transfer shaft 28 extends through end wall 3 to connect rigidly to transfer pinion gear 42. Transfer shaft 28 is journaled by shaft bearing 43a, which is in turn mounted within drive casing 16 in alignment with pivot point 18. Transfer shaft 28' (not shown in FIGS. 2 and 5) is connected and journaled in the same manner described for transfer shaft 28.

Figure 5A:
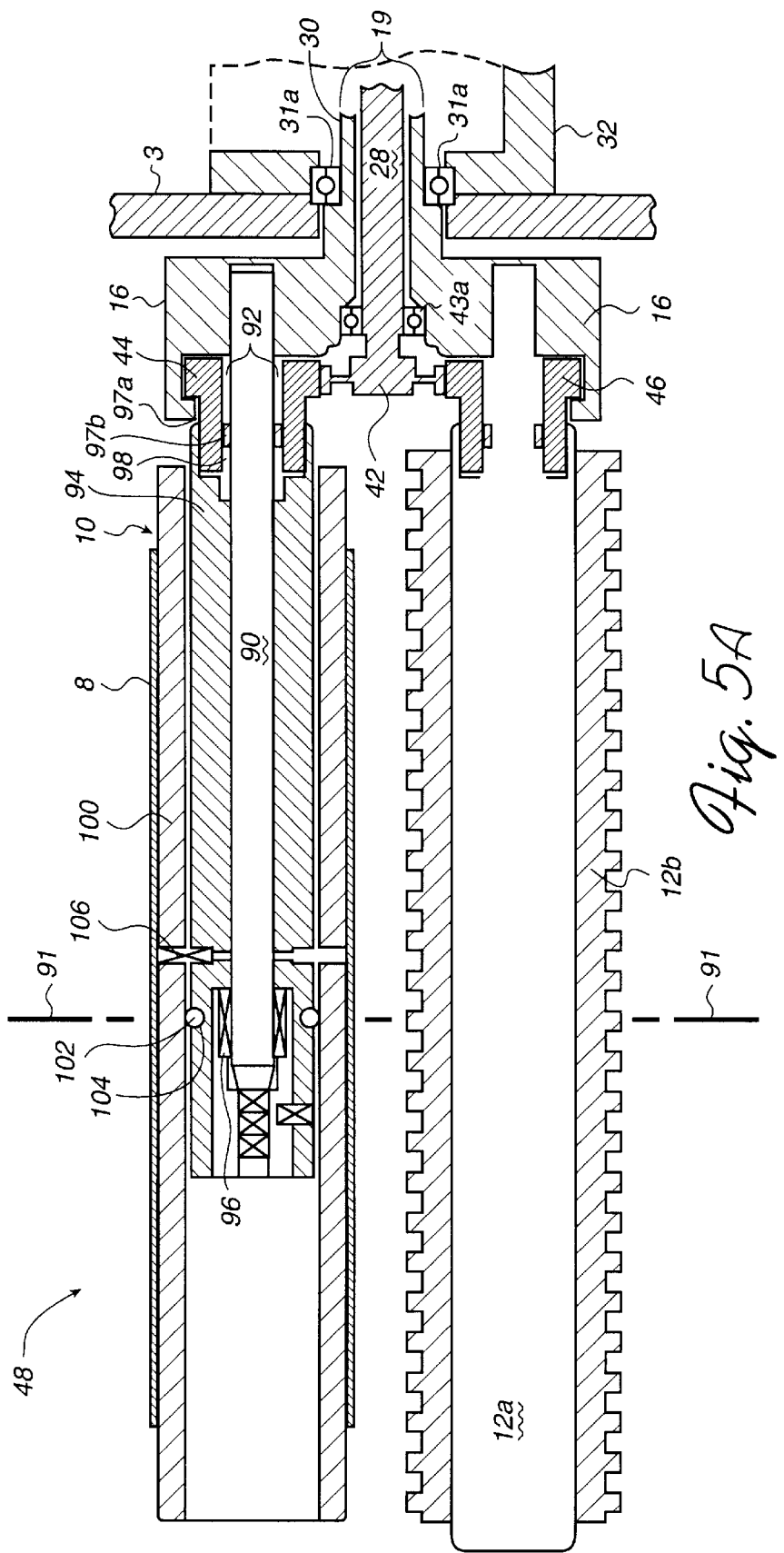
FIG. 5A is a cross-sectional view of a wafer preparation assembly, in which a self-aligning mandrel having a pad is combined with a brush, in accordance with an alternative embodiment of the invention.

As shown in detail in FIG. 5A, the inner portions of transfer shaft 28 and pivot shaft 30 extend through end wall 3. Transfer pinion gear 42 engages upper and lower mandrel gears 44 and 46, which are fixedly mounted to the end of upper and lower mandrels 10 and 14 (see FIGS. 1 and 2), respectively, so as to be aligned with the mandrel axis. It is noted that lower mandrel 14 shown in FIGS. 1 and 2 has been omitted from FIG. 5A in favor of brush core 12a and brush 12b in accordance with an alternative embodiment, as will be explained in more detail below. Thus, transfer gear 42 and mandrel gears 44 and 46 transmit torque to the mandrel bodies so that both upper and lower mandrels 10 and 14 rotate in the same direction simultaneously.

Upper and lower mandrels 10 and 14, respectively, may be rotatably mounted by conventional journal bearings to drive casing 16 so as to be driven by mandrel gears 44, 46 while at the same time being supported parallel to the face of wafer W. In one embodiment, mandrels 10 and 14 are supported by self-aligning mandrel assembly 48 that automatically aligns polishing pads 8, 12 with the face of wafer W upon contact with the wafer face so as to distribute the contact pressure of the pads evenly upon the surface of wafer W. Additional details of self-aligning mandrel assembly 48 are set forth below under the heading "Self-Aligning Mandrel Assembly."

With reference to FIG. 4A, wafer preparation drive assembly 17 includes separate drive motors 34, 34' for drive casings 16, 16'. Motors 34, 34' may be operated by conventional power supplies, controls, and feedback sensors (not shown) to rotate in opposite directions so that the pads (either 8, 8' or 12, 12') on opposite sides of wafer W are likewise counter-rotating, preferably at substantially the same rotational rate. The rotation of the pads is preferably selected so that the pads exert a downward frictional force on the wafer and thereby helps to maintain wafer engagement with wafer drive rollers 6, 6'. Motors 34, 34' may be manually controlled or may be sequenced and controlled by a suitably programmed computer system that activates conventional motor controllers (not shown). It will be apparent to those skilled in the art that, if desired, a single motor may be used with a suitable power transmission, such as a belt or gear transmission, to provide rotational power to both drive casings.

Pad engagement mechanism 15 controls the pivoting action of drive casings 16, 16' to bring either upper polishing pads 8, 8' or lower polishing pads 12, 12' into contact with the opposing faces of wafer W. As shown in FIG. 4A, outer pivot shafts 30, 30' have levers 52, 52' mounted thereon such that each lever is directed generally inward toward the wafer plane of symmetry, Wp. The end portion of each of levers 52, 52' is formed as a gear segment, and gear segments 54, 54' have the same radius and are concentric with outer pivot shafts 30, 30', respectively. Gear segments 54, 54' are intermeshed so that levers 52, 52' and pivots shafts 30, 30' coupled thereto are slaved together to pivot in a coordinated manner in opposite directions.

Linear actuator 56, which may be a conventional air cylinder or other equivalent actuator, is mounted to the lower portion of frame 32 (see FIGS. 2 and 4A), with actuator output rod 58 extending upward to pivotal connection 59 adjacent to the end portion of lever 52 (see FIGS. 4A and 4B). Thus, an upward extension of rod 58 causes lever 52 to pivot counter-clockwise (from the perspective of FIG. 4A) and causes opposite lever 52' to pivot clockwise through an equal angle via enmeshed gear segments 54, 54'. As shown in FIG. 4B, rod 58 is extended upward (relative to the position shown in FIG. 4A) to pivot the levers 52, 52' in the manner just described. Those skilled in the art will recognize that a downward retraction of rod 58 (not shown) produces a pivoting action opposite to that shown in FIG. 4B. In other words, when rod 58 is retracted downwardly, lever 52 pivots clockwise and lever 52' pivots counter-clockwise.

As shown in FIGS. 2 and 5A, outer pivot shaft 30 is rigidly connected to drive casing 16 so that any rotation of pivot shaft 30 causes a like rotation of the drive casing. The rotation of drive casing 16 in turn causes a corresponding movement of the upper and lower mandrels 10 and 14 (or brushes 12a/12b), respectively, toward or away from the plane of wafer W. The range of throw of actuator rod 58 is preferably selected and controlled to provide a pivoting range of outer pivot shafts 30, 30' sufficient to permit selective engagement of upper and lower polishing pads 8 and 12, respectively, with wafer W. As noted above, the pivoting range will depend on, among other things, the diameter of the polishing pads. The motion of linear actuator 56 may be manually controlled by conventional actuator controls and power supplies (not shown) or, alternatively, may be sequenced and controlled by a suitably programmed computer system that activates conventional controllers (not shown). If desired, conventional feedback sensors or load regulators may be included to control the force applied by linear actuator 56 via wafer preparation drive assembly 17 so that one or both of the contact force and surface pressure of the polishing pads on wafer W may be controlled.

It will be apparent to those skilled in the art that alternative power transmission systems may be used to provide rotational and pivotal power and control to drive casings 16, 16'. It also will be apparent to those skilled in the art that alternative configurations of drive casings 16, 16' and wafer preparation drive assembly 17 may be used. For example, drive motors may be mounted directly to drive casings 16, 16' to provide rotational power to polishing pads 8, 8' and 12, 12' without the use of a coaxial shaft. Further, drive casings 16, 16' may be moved toward or away from the wafer with a linear motion rather than a pivotal motion by, for example, mounting the drive casings to a telescoping linear actuator directed toward one of the opposing wafer faces.

Variable Height Edge Drive Assembly: Variable height edge drive assembly 23 includes coaxial shaft assembly 61 as a component of both roller drive mechanism 21 and wafer translation mechanism 27 (see FIGS. 1 and 2). Coaxial shaft assembly 61 delivers both rotational power to wafer drive rollers 6, 6' for wafer rotation and also pivotal activation and control to roller arms 20, 20' for adjusting the vertical position of wafer W with respect to polishing pads 8, 8' and 12, 12'. Variable height edge drive assembly 23 includes separate coaxial shaft assemblies 61, 61' for front and rear roller arms 20, 20', respectively. The description herein regarding the structure and operation of coaxial shaft assembly 61 and front roller arm 20 therefore generally applies to the structure and operation of coaxial shaft assembly 61' and rear roller arm 20'.

As shown in FIG. 1, coaxial shaft arrangement 61 includes inner transfer shaft 60 and hollow, outer, roller pivot shaft 62. Transfer shaft 60 is an element of roller drive mechanism 21, and transmits rotational power to roller 6 via transfer belt 64. Transfer shaft 60 is journaled to bearings 63a and 63b, which are mounted on the inside of roller pivot shaft 62 adjacent to each end of the shaft. Roller pivot shaft 62 is in turn journaled to a support structure, e.g., right wall 4, by bearings 65a and 65b. Roller pivot shaft 62 provides pivoting control of roller arm 20 so as to move roller 6 between an upward/inward position 6a and a lower/outward position 6b, as shown in FIG. 2.

As shown in FIGS. 1 and 2, roller drive mechanism 21 includes left and right roller motors 66, 66', respectively, which are mounted to the lower portion of right wall 4. Motors 66, 66' are rotatably coupled to drive pulleys 68, 68', respectively, which engage drive belts 70, 70'. Outer transfer shaft pulleys 72, 72', which are mounted to the ends of transfer shafts 60, 60', respectively, that extend through right wall 4, also engage drive belts 70, 70'.

With reference to FIG. 1, the end of transfer shaft 60 that extends through right wall 4 is rigidly mounted to inner transfer pulley 74 within roller arm casing 76 so as to be in alignment with roller arm pivot point 22. Inner pulley 74 engages roller transfer belt 64, which extends within roller arm casing 76 to engage roller pulley 78. Roller pulley 78 is mounted to the end of roller shaft 80 journaled adjacent to the outer end of roller arm casing 76. Roller shaft 80 in turn extends through roller arm casing 76 toward the plane of wafer W to support wafer drive roller 6 outside of the casing.

In one embodiment, roller drive mechanism 21 includes separate drive motor 66, 66' for each of roller drive arms 20, 20', as shown in FIG. 2. Motors 66, 66' may be operated by conventional power supplies, controls, and feedback sensors (not shown) to rotate in the same direction so that wafer drive rollers 6, 6' rotate in the same direction at substantially equal rotational rates. Motors 66, 66' may be manually controlled or may be sequenced and controlled by a suitably programmed computer system that activates conventional motor controllers (not shown). In another embodiment, a single motor is used with suitable power transmission, such as a belt or gear transmission, to provide rotational power to both roller drive arms.

As shown in FIGS. 1–3, wafer translation mechanism 27, which provides pivotal actuation and control of roller drive arms 6, 6', includes right and left roller pivot shafts 62, 62', respectively (left roller pivot shaft 62' is not shown in FIGS. 1–3), each of which extends a distance beyond, i.e., outside, right wall 4. The outer end of each roller pivot shaft 62, 62' is surrounded by and fixed to one of a pair of co-planar gear rings 82, 82', the effective outer diameter of each of the gear rings preferably being one-half the span between roller arm pivot points 22, 22', so that the front and rear gear rings 82, 82', respectively, intermesh at the approximate mid-span. Intermeshed gear rings 82, 82' cause the respective roller pivot shafts 62, 62' to be slaved together to pivot in a coordinated manner in opposite directions. Roller pivot shafts 62, 62' are rigidly connected to roller arm casings 76, 76', respectively, so that any pivoting motion of the shafts produces a like pivoting motion of roller drive arms 20, 20' and wafer drive rollers 6, 6'.

As shown in FIG. 2, linear actuator 84, which may be a linear stepper motor or other equivalent actuator, is mounted generally horizontally to the lower outside portion of right wall 4. Actuator output rod 86 extends laterally to pivotal connection 87 adjacent the end portion of actuator lever 88. Actuator lever 88 is in turn fixed to the side of one of the gear rings 82, 82'. An outward extension of rod 86 causes lever 88, gear ring 82 (or 82'), and roller pivot shaft 62 to pivot counter-clockwise (from the perspective of FIG. 2), which in turn causes opposite enmeshed gear ring 82' (or 82) and pivot shaft 62' to pivot clockwise through an equal angle. This pivoting action moves wafer drive rollers 6, 6' toward their lower, outward positions 6b, 6b'. An inward retraction of rod 86 produces a corresponding opposite pivoting action that moves wafer drive rollers 6, 6' toward their upper, inward positions 6a, 6a'.

The range of throw of actuator rod 86 is preferably selected and controlled to provide a pivoting range of shafts 62, 62' sufficient to move wafer W through a preselected vertical range, as indicated by arrow C (see FIG. 2). This preselected vertical range is formulated to bring the desired portions of the wafer in position to engage polishing pads 8, 8' or 12, 12', as will be explained in more detail later. The diameter of wafer drive rollers 6, 6' and the length of roller drive arms 20, 20' may be preselected to accommodate a predetermined range of wafer diameters, e.g., 200 mm wafers and 300 mm wafers. If desired, substitute roller drive arm casings 76, 76', roller transfer belts 64, 64', and wafer drive rollers 6, 6' may be provided in a range of sizes for convenient installation to permit the geometry of roller drive mechanism 21 to be adjusted to suit an even broader range of wafer diameters. In this same vein, substitute actuator levers 88 may be provided in a range of lengths (or lever 88 may be mechanically adjustable in length) to adjust the mechanical advantage of linear actuator 84. The motion of linear actuator 84 may be manually controlled by conventional actuator controls and power supplies (not shown) or, alternatively, may be sequenced and controlled by a suitably programmed computer system that activates conventional controllers (not shown).

It will be apparent to those skilled in the art that alternative power transmission systems may be used to provide rotational and pivotal power and control to wafer drive rollers 6, 6' and roller drive arms 20, 20'. It also will be apparent to those skilled in the art that the configuration of the variable height edge drive assembly be varied from that shown herein. For example, an alternative variable height edge drive assembly may include non-pivoting wafer drive rollers and associated motors mounted to a variable height support platform.

Self-aligning Mandrel Assembly: As shown in FIG. 5A, upper mandrel 10, to which polishing pad 8 is affixed, is supported by self-aligning mandrel assembly 48. Mandrel assembly 48 includes rigid, cylindrical, rod-like spine 90, which is rigidly connected to wafer preparation drive casing 16 so as to provide a cantilevered support for mandrel 10. Spine 90 extends generally parallel to wafer W and terminates at point beyond mandrel centerline 91. Upper mandrel gear 44, which has a hollow core, surrounds spine 90 and is journaled upon the spine by gear bearing 92, so that the mandrel gear may rotate independently of the fixed spine (spine 90 is fixed relative to drive casing 16). Upper mandrel gear 44 connects to mandrel core 94 so as to transmit rotational torque thereto. Mandrel core 94, which is formed as a hollow cylinder and surrounds spine 90 with clearance, is journaled on core bearing 96 adjacent mandrel centerline 91 so that the core may rotate independent of the spine when driven by mandrel gear 44. Seals 97a and 97b are situated on the outside and inside of the hollow shaft 98 of mandrel gear 44. The seals 97a and 97b are configured to keep fluids and/or slurry out of the drive casings 16.

Mandrel shell 100, which is formed as a hollow cylinder and extends at least the desired length of polishing pad 8, surrounds mandrel core 94 with clearance. Mandrel shell 100 is supported by shell center fulcrum 102 at a point adjacent to mandrel centerline 91. Shell center fulcrum 102 may be any suitable structure that surrounds core 94. In one embodiment, shell center fulcrum 102 is a resilient O-ring disposed in groove 104 formed in the outer surface of mandrel core 94. Shell center fulcrum 102 provides a center support for mandrel shell 100 while permitting the shell to tilt through a small angle away from parallel to core 94. The clearance between mandrel core 94 and mandrel shell 100 is selected to permit the shell to tilt through a predetermined tilt range. Polishing pad 8 is affixed to the outer surface of mandrel shell 100. In one embodiment, polishing pad 8 is spirally wrapped around mandrel shell 100 such that the polishing pad is substantially symmetrically disposed about mandrel centerline 91.

Torque connector 106 is mounted between mandrel core 94 and mandrel shell 100. The function of torque connector 106 is to transmit rotational torque from the core to the shell as well as to fix the shell with respect to axial movement relative to the core, while still permitting the shell to tilt within the predetermined tilt range. In one embodiment, torque connector 106 is a spring-loaded key structure set in aligned slots in mandrel core 94 and mandrel shell 100. In another embodiment, torque connector 106 is a drive pin.

As polishing pad 8 is pressed into contact with one of the surfaces of wafer W (not shown in FIG. 5A) by the pivoting action of drive casing 16, the contact pressure of the polishing pad with the wafer will cause mandrel shell 100 to tilt until the polishing pad is aligned parallel to one of the wafer surfaces and the contact pressure is evenly distributed along the line of contact. Torque connector 106 simultaneously transmits rotational torque to mandrel shell 100 so that polishing pad 8 rotates and thereby generates polishing action on the surface of the wafer.

Figure 5B:
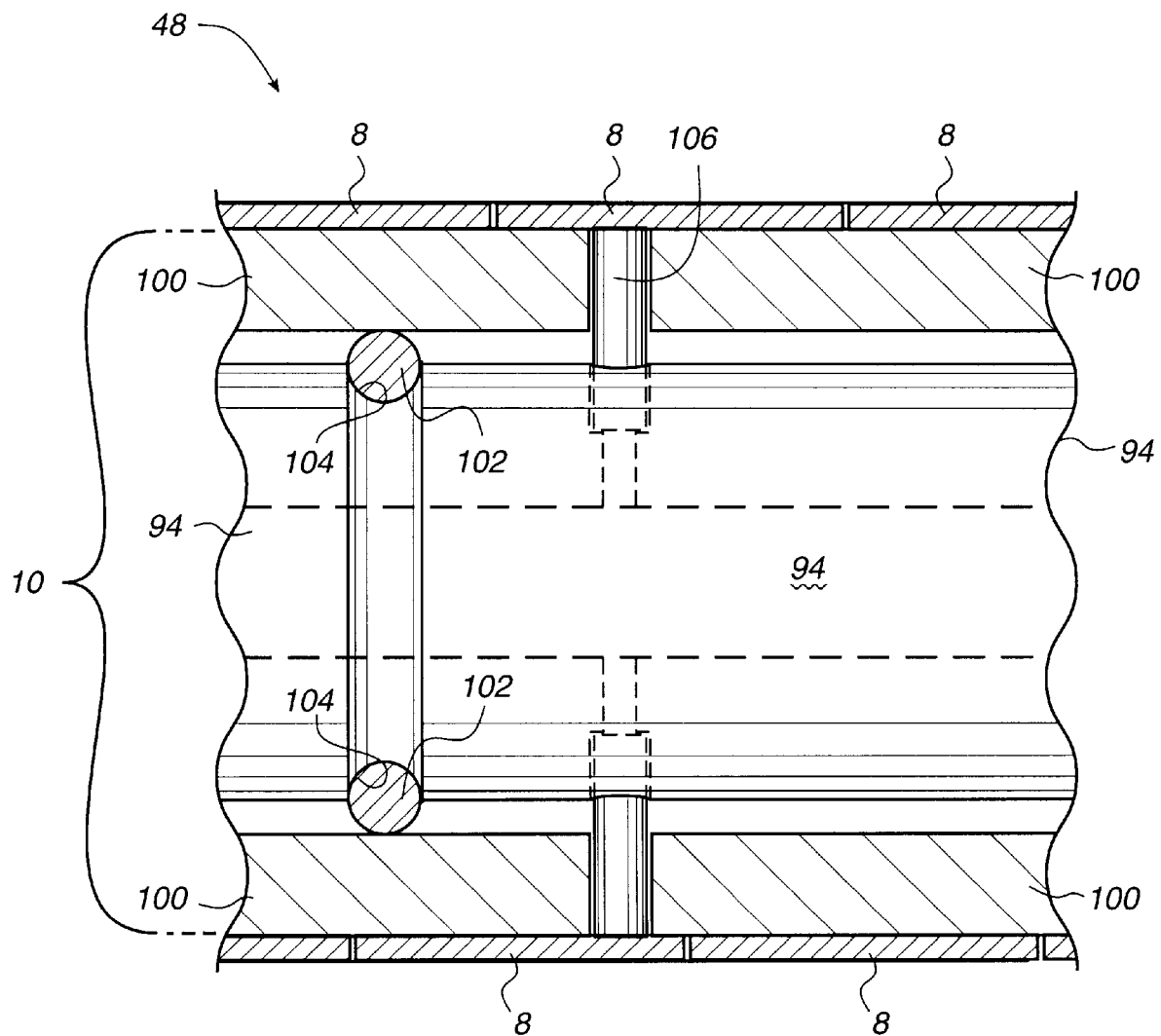
FIG. 5B is a more detailed view of a self-aligning mandrel assembly shown in FIG. 5A that focuses on the region proximate to shell center fulcrum.

FIG. 5B is a more detailed view of self-aligning mandrel assembly 48 shown in FIG. 5A that focuses on the region proximate to shell center fulcrum 102. As noted above, shell center fulcrum 102 is shown as an O-ring. In one embodiment, the O-ring has a durometer hardness of about 70–80 on the Shore A scale. The O-ring is seated in groove 104 formed in mandrel core 94, which may be formed of plastic material. It will be apparent to those skilled in the art that spine 90 has been omitted from FIG. 513 for ease of illustration. Groove 104 is located at the centerline of mandrel shell 100, which may be formed of stainless steel. Torque connector 106, which is shown as a drive pin, is disposed in corresponding holes in mandrel shell 100 and mandrel core 94. As shown in FIG. 5B, the hole in mandrel shell 100 is oversized for the drive pin so that the mandrel shell is free to pivot about the O-ring, as described above. In one embodiment, the ends of mandrel shell 100 can move up to about ±0.060 inch. Polishing pad material 8 is spirally wrapped around mandrel shell 100 such that there is a slight gap between the wrap. This configuration avoids any overlap of the polishing pad material, which may adversely affect the polishing operation. In one embodiment, the polishing pad material is polyurethane foam.

Fluid Injection: As shown in FIG. 1, a plurality of nozzles 110 are mounted to the walls of housing 2. Nozzles 110 are directed to spray fluids toward the opposing faces of wafer W or polishing pads 8, 8' and 12, 12'. Suitable fluids, which are supplied to nozzles 110 by manifolds 112, include abrasive slurries, chemical treatment solutions, emulsions, cleaning solutions, rinse solutions, coolant solutions, deionized (DI) water, and mixtures thereof. If desired, different fluids may be injected simultaneously from different nozzles or may be injected in sequence from the same or different nozzles. Drain 114 in sloped floor 5 is provided to facilitate removal of spent fluids from the interior of housing 2. Additional nozzles and manifolds may be located within housing 2 to rinse slurries or solutions from wafer preparation members such as polishing pads and brushes as well as from support components such as mandrels, drive casings, rollers, and roller arms upon completion of one or more wafer preparation operations. The fluids may be supplied to manifolds 112 by conventional conduits, valves, pumps, storage tanks, filters, and sumps (not shown) coupled in flow communication with the manifolds. The sequence and rate of fluid injection may be manually controlled or, alternatively, may be automatically controlled by a suitably programmed computer that operates conventional valves, pumps, and actuators.

Pad Conditioners: As shown in FIGS. 1 and 3, optional retractable pad conditioners 116 are pivotally mounted to the inside walls of housing 2 adjacent to each polishing pad. Each conditioner 116 includes generally horizontal blade 118 that spans substantially the entire length of the polishing pad disposed proximate thereto. Each blade 118 is pivoted at pivot 120 above the blade, so that the blade may be extended toward the adjacent polishing pad by impingement of actuator 122. Actuator 122 may be a conventional solenoid actuator mounted to impinge an output rod 124 against the outer portion of blade 118, thereby causing the blade to pivot inward through angle D. Pad drive casings 16, 16' may be simultaneously moved through angle E (pad 8) or angle E' (pad 10) to bring the respective polishing pads into contact with the corresponding blade 118 for conditioning. Angles D and E and the conditioner dimensions are preferably selected so that each of the polishing pads 8 and 10 may be conditioned without either pad contacting the surface of wafer W. In other words, pad conditioning preferably takes place with the polishing pads in the neutral" position so that the wafer need not be removed for pad conditioning. Upon completion of a pad conditioning operation, each of blades 118 may be retracted by deactivating actuators 122.

Figure 10:
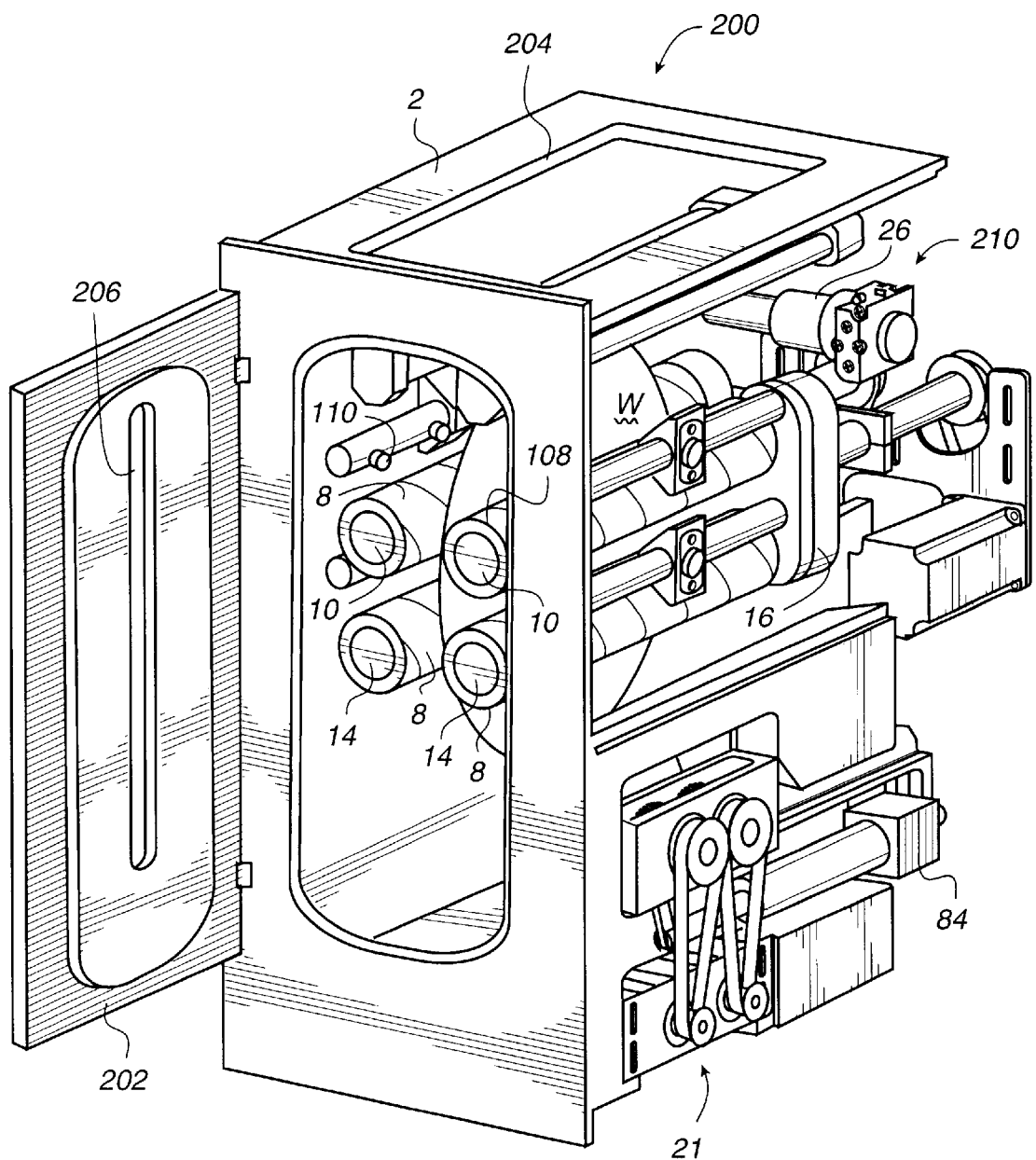
FIG. 10 shows a three-dimensional diagram of a wafer preparation station in accordance with one embodiment of the invention.

FIG. 10 shows a three-dimensional diagram of a wafer preparation station 200 in accordance with one embodiment of the invention. The wafer preparation station 200 includes a housing 2 which is configured to enclose a wafer preparation apparatus 210. A top portion of the housing 2 includes an opening 204 through which the wafer can be lifted out and placed into another processing station, if desired. Alternatively, the opening 204 can be omitted leaving a fully-enclosed wafer preparation apparatus 210. The housing 2 also includes a door 202 which is configured to allow access to the wafer preparation apparatus for maintenance, such as to replace or insert scrub brushes or polishing pads and associated mandrels.

During operation, the door 202 is preferably closed to preserve the cleanliness of the environment and to reduce the exposure to particulates and debris. In one preferred embodiment, a slot 206 is provided in the door 202 to enable the wafer W to be inserted into the wafer preparation station 200. In the same manner, the wafer can be removed from the wafer preparation station through the slot 206. In still a further embodiment, the door 202 can include a slider door (not shown), which will close the slot 206 when the wafer is being processed.

As an overview, the wafer preparation apparatus 210 includes mandrels 10 and 14 which are provided with pads 8. In this implementation, both sets of mandrels 10 and 14 are provided with the pads 8 to facilitate buffing or polishing of the wafer by either the lower set of mandrels or the upper set of mandrels when desired. As mentioned above, the wafer is configured to be raised and lowered during preparation, and the first set of mandrels or the second set of mandrels can be positioned to achieve the aforementioned off-center processing. Also shown are the nozzles 110, which can be configured to direct fluids onto the pads 108. The nozzles 110 can be coupled in flow communication with an appropriate source to provide DI water, chemicals, or slurry, depending upon the process being performed. The wafer preparation apparatus 210 is also shown including the alignment tensioner 26 which, as described above, is configured to apply the wafer top alignment roller 24 to a top edge of the wafer. This illustration also shows a linear actuator 84 (which is preferably a linear stepper motor), that is used to cause the wafer to be raised or lowered in accordance with a wafer movement schedule formulated to achieve a desired wafer material removal rate at various radial locations on the wafer surface. The linear actuator 84 is shown in greater detail in FIG. 11A. Also shown is the roller drive mechanism 21, which is designed to cause the rotation of each of the wafer drive rollers 6.

FIG. 11A illustrates in greater detail the wafer preparation apparatus 210. The wafer preparation apparatus 210 is generally configured to include a first pair and a second pair of wafer preparation assemblies 212. Each of the wafer preparation assemblies 212 will reside on a particular side of the wafer W. For example, the wafer reparation assembly 212 is shown to include a mandrel 10 and a brush 12b connected to a drive casing 16. On the opposite side of the wafer, another wafer preparation assembly 212 is provided, also including a mandrel 10 for the bottom part of the assembly and a brush 12b for the top part of the assembly.

This illustration is provided to make clear that the wafer preparation apparatus 210 can be configured in many ways. For example, each of the wafer preparation assemblies 212 can be configured to include mandrels that have polishing pads 8 affixed thereto as shown in FIG. 10. In the illustrated embodiment of FIGS. 11A and 11B, the bottom part of the wafer preparation assembly 212 is a mandrel 10 and the top part is a brush 12b. In the case of brush 12b, the mandrel is replaced with a standard brush core 12a which connects to the drive casing 16. In one embodiment, the brushes 12b can be polyvinyl alcohol (PVA) brushes. The PVA brush material is configured to be soft enough to prevent damage to the wafer's delicate surface, yet can provide good mechanical contact with the wafer surface to dislodge residues, chemicals and particulates. Exemplary cleaning systems that implement PVA brushes include those described in U.S. Pat. No. 5,875,507, which is incorporated herein by reference. Further, a standard brush core 12a can, in one embodiment, be configured to deliver fluids through the brush (TTB).

As mentioned above, linear actuator 84 is configured to have an actuator output rod 86, which connects to an actuator lever 88. The combination of the linear actuator 84, the actuator output rod 86, and the actuator lever 88 is configured to assist in moving the roller arms 20 in an upward or downward direction to enable movement of the wafer W up or down, depending on the location (i.e., on-center or off-center) desired for buffing, polishing, or scrubbing. The motors 66 are configured to cause the rotation of the wafer drive rollers 6 by way of the roller arms 20 as shown in FIG. 11B.

Still referring to FIG. 11A, a wafer preparation drive assembly 17 is provided to provide a connection and support location for each of the wafer preparation assemblies 212. As shown, the wafer preparation drive assembly 17 includes a frame 32. The frame 32 provides support for a pair of outer pivot shafts 30. Each of the outer pivot shafts 30 connects to one of the wafer preparation assemblies 212 through the frame 32. Each of the outer pivot shafts 30 also includes an inner transfer shaft 28. The belts 38 link together the transfer shaft pulley 40 and the drive pulley 36, thus causing a rotation by way of wafer preparation drive motor 34. The rotation of the transfer shaft pulley 40 thus causes the rotation of the inner transfer shaft 28 that transfers that rotation to the drive casing 16. The rotation of the inner transfer shaft 28 is therefore transferred to each of the mandrels 10 and brushes 12b.

By way of example, the rotation of the inner transfer shaft 28 will cause a rotation of gears within drive casing 16. The rotation of the gears within the drive casing 16 will cause the brush 12b to rotate as well as the mandrel 10. With regard to FIGS. 11A and 11B, the mandrel 10 of each of the wafer preparation assemblies 212 will contact the wafer W at the same time from both sides of the wafer while the brushes 12b are spaced apart from the wafer. In the same manner, the drive casing 16 can be tilted in the opposite direction so that only the brushes 12b of the wafer preparation assemblies are contacting the wafer on each side. In this situation, the mandrels 10 will be spaced apart from the wafer, thus allowing only brush scrubbing of the wafer surfaces. The mechanism configured to pivot the drive casings 16 so that only one of either the mandrel 10 or the brush 12b is in contact with a surface of the wafer is shown and described in greater detail above.

Methods of Wafer Preparation: One of the methods of wafer preparation provided by the present invention is an off-diameter polishing method that produces an overall more radially uniform removal of wafer material during a polishing operation relative to conventional centerline polishing. Before polishing, a wafer may be planarized using a conventional planarization technique, e.g., CMP. In one embodiment, the off-diameter polishing produces a polished surface without producing substantial departures from the initial planar surface. FIGS. 6–9 show examples of both centerline (on-diameter) polishing and off-diameter polishing.

Figure 6:
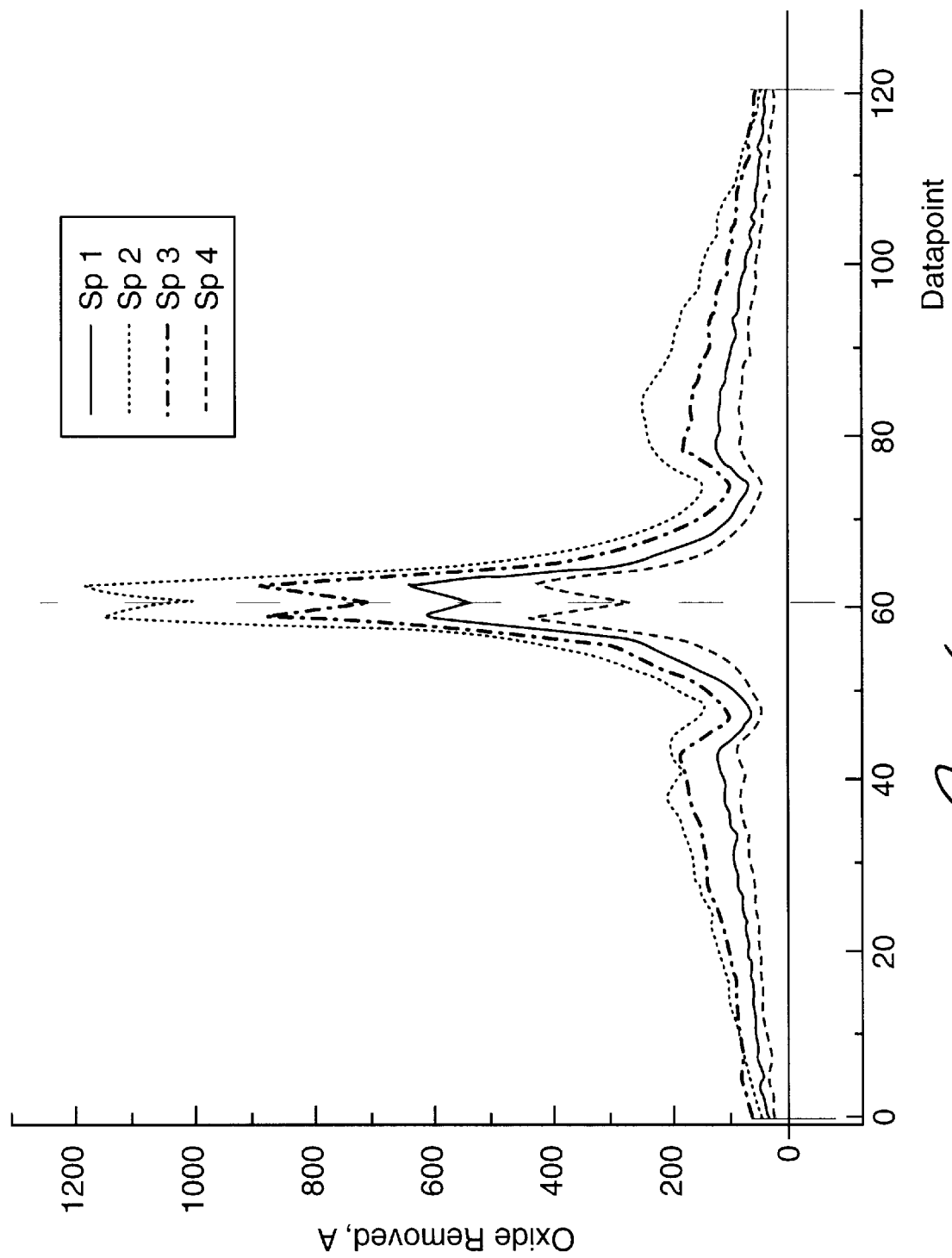
FIG. 6 is a graph that shows the amount of wafer material removed versus radial location across the wafer face for four test wafers subjected to conventional centerline polishing.

FIG. 6 is a graph of the amount of wafer material removed versus radial location across the wafer face for four samples of centerline polishing as in the prior art. The amount of wafer material removed is plotted on the vertical axis (in angstroms ($10^{-10}$ m)) and the radial location of the test point is plotted on the horizontal axis (121 evenly spaced points across the wafer diameter, with a 5 mm edge exclusion). As shown in FIG. 6, centerline polishing in which the line of contact of the pad crosses the wafer center typically results in significantly more wafer material being removed from the center region of the wafer than is removed from the peripheral regions of the wafer.

In circumferential polishing operations, the rotational speed of the polishing pads is typically higher than that of the wafer. The polishing pads push on each side of the wafer, preferably with equal pressure on each side, as they counter-rotate inward toward the nip, with the pad surface rotation at the line of contact being oriented downwardly. The absolute amount of wafer material removed at a particular point is a function of factors such as polishing time, pad contact pressure, pad composition, pad rotational rate, wafer rotational rate, and abrasive slurry composition. Nevertheless, the relative amount of wafer material removed in a typical centerline polishing operation may be an order of magnitude greater near the center of the wafer, as demonstrated by the pronounced peak in the amount of substrate material removed between points 50 and 70 in FIG. 6. The wafer contour produced by such centerline polishing is the inverse of the curve shown in FIG. 6. In other words, the high wafer material removal rate near the wafer center produces a concave or "dished" contour near the wafer center. Thus, for a given set of polishing parameters, the wafer material removal rate is highly non-uniform across the span of contact of the polishing pad with the wafer.

Figure 7A:
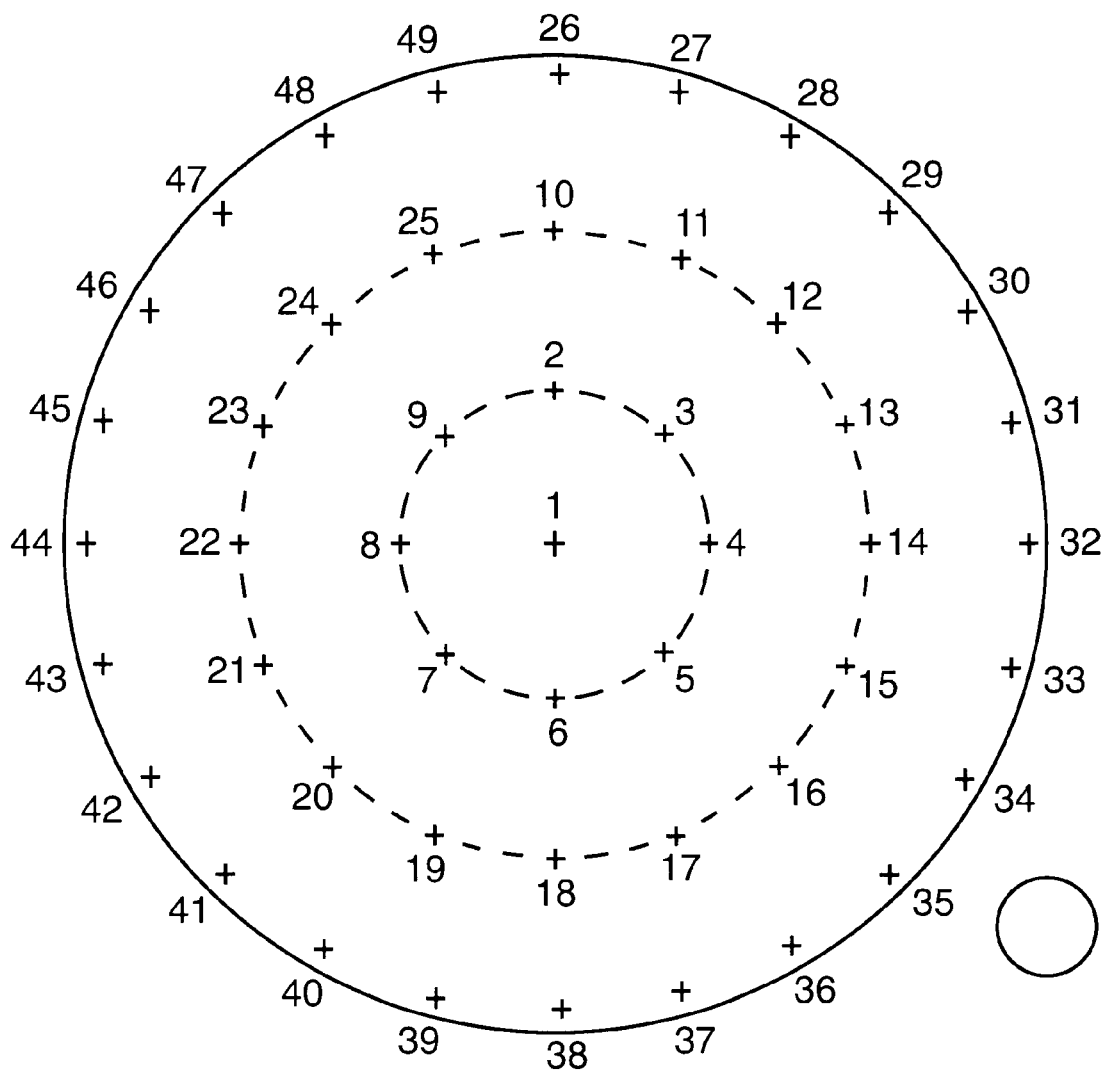
FIGS. 7A and 7B together show the angular distribution of wafer material removed from four test wafers subjected to conventional centerline polishing.
Figure 7B:
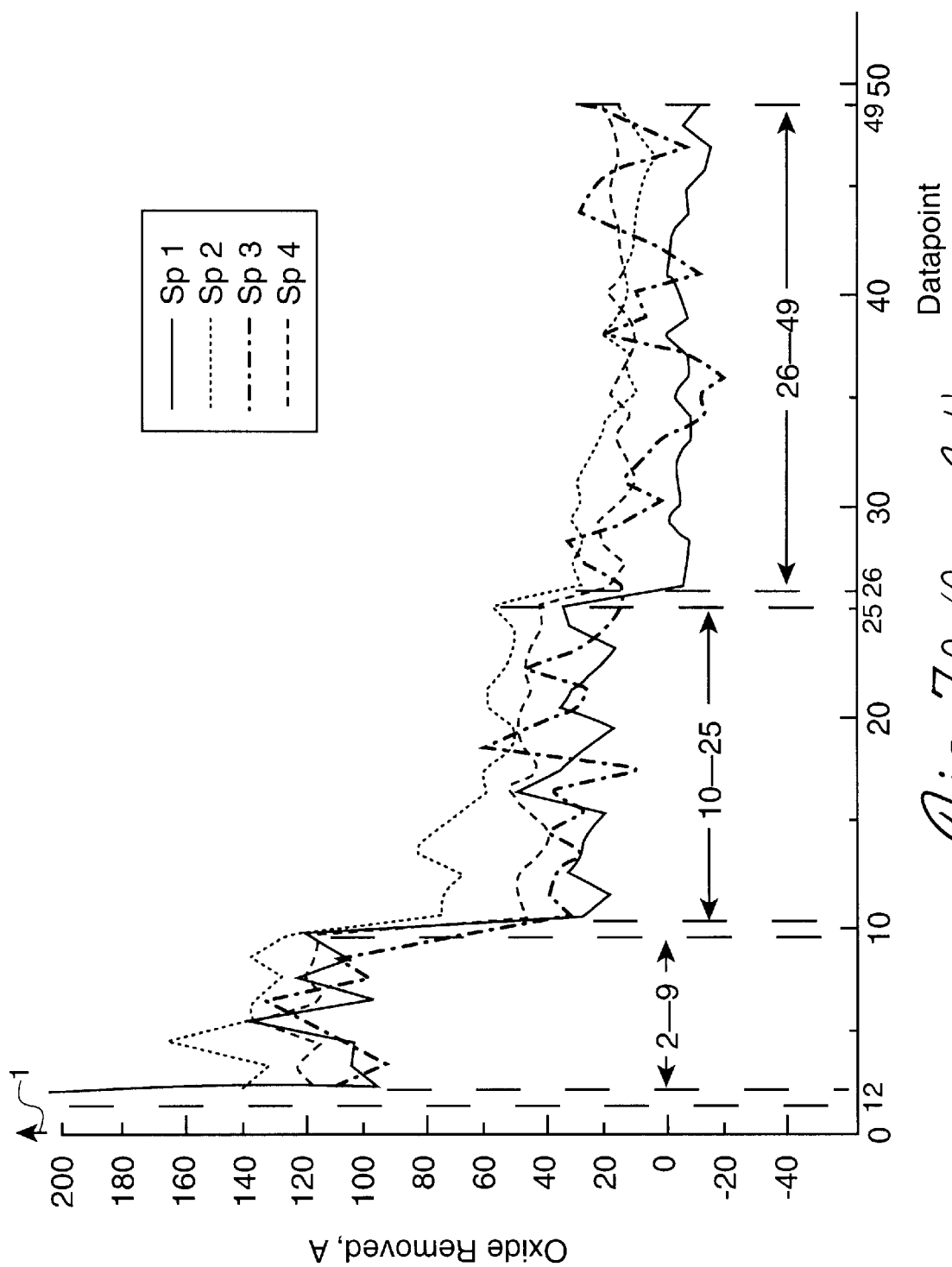

FIGS. 7A and 7B demonstrate that the removal of wafer material in centerline polishing tends to be substantially radially symmetrical within a modest range of random variation. FIG. 7A shows 49 test point locations for four different samples of centerline polishing. FIG. 7B is a graph of the amount of substrate material removed (measured in angstoms greater or less than mean thickness change) at each point for the four samples. As shown in FIG. 7A, the test points include the wafer center (point 1), an evenly-spaced concentric ring at about one-third of the radius (points 2–9), a similar ring at about two-thirds of the radius (points 10–25), and a similar ring inset about 5 mm from the wafer perimeter (points 26–49). FIG. 7B is scaled so that the wafer center (point 1) is off the plot, to allow greater detail and clarity in the plot of points 2–49 because, as discussed of above, the amount of substrate material removed near the center is an order of magnitude greater than the amount removed over a majority of the wafer surface. As shown in FIG. 7B, the amount of substrate material removed falls into three distinct "steps," which correspond to the three concentric rings of test points. The variation within each step has a random character and shows no systematic angular trend.

In the off-diameter polishing method of the invention, just as in centerline polishing, the absolute amount of substrate material removed at a particular point on the wafer surface is a function of the various parameters set forth above in connection with the description of FIGS. 6, 7A, and 7B. In off-diameter polishing in accordance with the invention, however, the amount of substrate material removed also is a function of the motion of the wafer relative to the line of contact of the polishing pads. Accordingly, the wafer preparation apparatus of the invention enables the movement of the wafer relative to the wafer preparation members, e.g., polishing pads, to be controlled. This enables the amount of substrate material removed at various locations across the surfaces of the wafer to be controlled so that a planar or other desired contour is obtained.

A controlled wafer movement schedule may be formulated in which the wafer is moved either up or down relative to the polishing pads to obtain the desired contour for the wafer surfaces. At some point during the polishing operation, the pad line of contact must cross the wafer center, i.e., the zero radial distance position, to ensure that the entire surface of the wafer is polished. It will be apparent to those skilled in the art that the wafer movement schedule may be formulated so that the pad line of contact either starts at the wafer center and moves toward the edge of the wafer or starts at the edge of the wafer and moves toward the wafer center.

Those skilled in the art will recognize that other polishing parameters such as, for example, the pad rotation rate, the wafer rotation rate, the pad bearing pressure, or a combination of these parameters also may be controlled to obtain the desired amount of substrate material removal across the wafer. The movement of the wafer relative to the polishing pads as well as the other polishing parameters may be controlled by suitable software code read by a computer system that actuates conventional control devices to govern the polishing operation. By way of example, the control devices may govern the operation or one or more of linear actuator 84 for moving the wafer up and down, drive roller motors 66, 66', linear actuator 56 for pivoting drive casings 16, 16', and pad motors 34, 34'.

The off-diameter polishing method of the invention advantageously compensates for the radial variation in the rate of removal of substrate material from the wafer surface by moving the wafer relative to the polishing pads to obtain a polished wafer surface having a planar or other desired contour. By controlling the speed at which the wafer is moved relative to the polishing pads (or by controlling other polishing parameters to achieve the same effect as controlling the wafer speed), desired substrate material removal rates may be obtained at different radial locations on the wafer surfaces. If desired, the polishing parameters may be controlled to obtain a substantially uniform substrate material removal rate across the wafer. This control regime may be particularly useful for polishing wafers having planarized surfaces. Alternatively, the polishing parameters may be controlled to vary the substrate material removal rate across the wafer. This control regime may be particularly useful for polishing wafers that have contoured, e.g., concave or convex, surfaces to obtain polished wafers having substantially planarized surfaces.

Figure 8A:
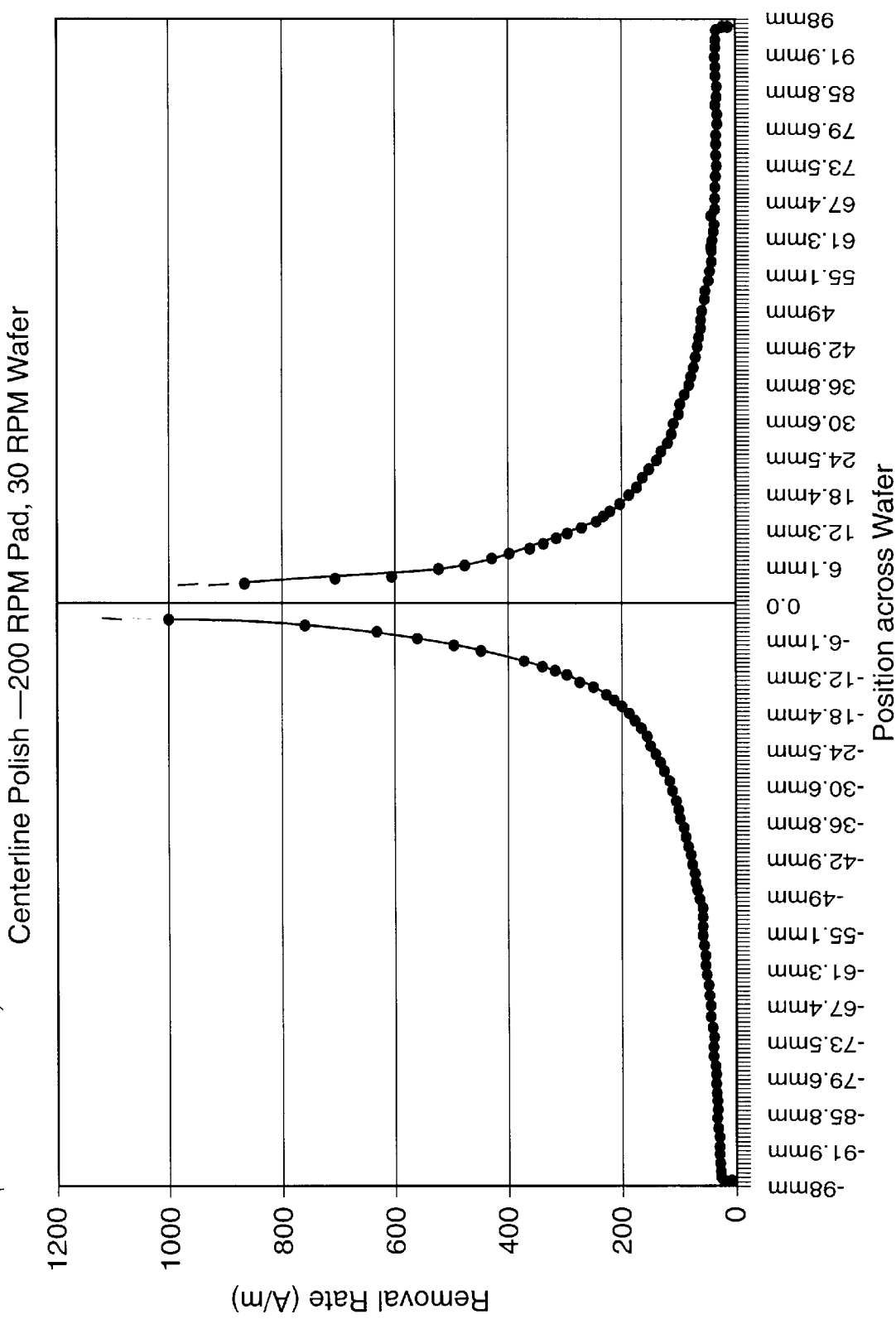
FIGS. 8A and 8B are graphs showing the wafer material removal rate (A/m) versus position across the wafer for test wafers polished at the wafer centerline only in accordance with conventional practice.
Figure 8B:
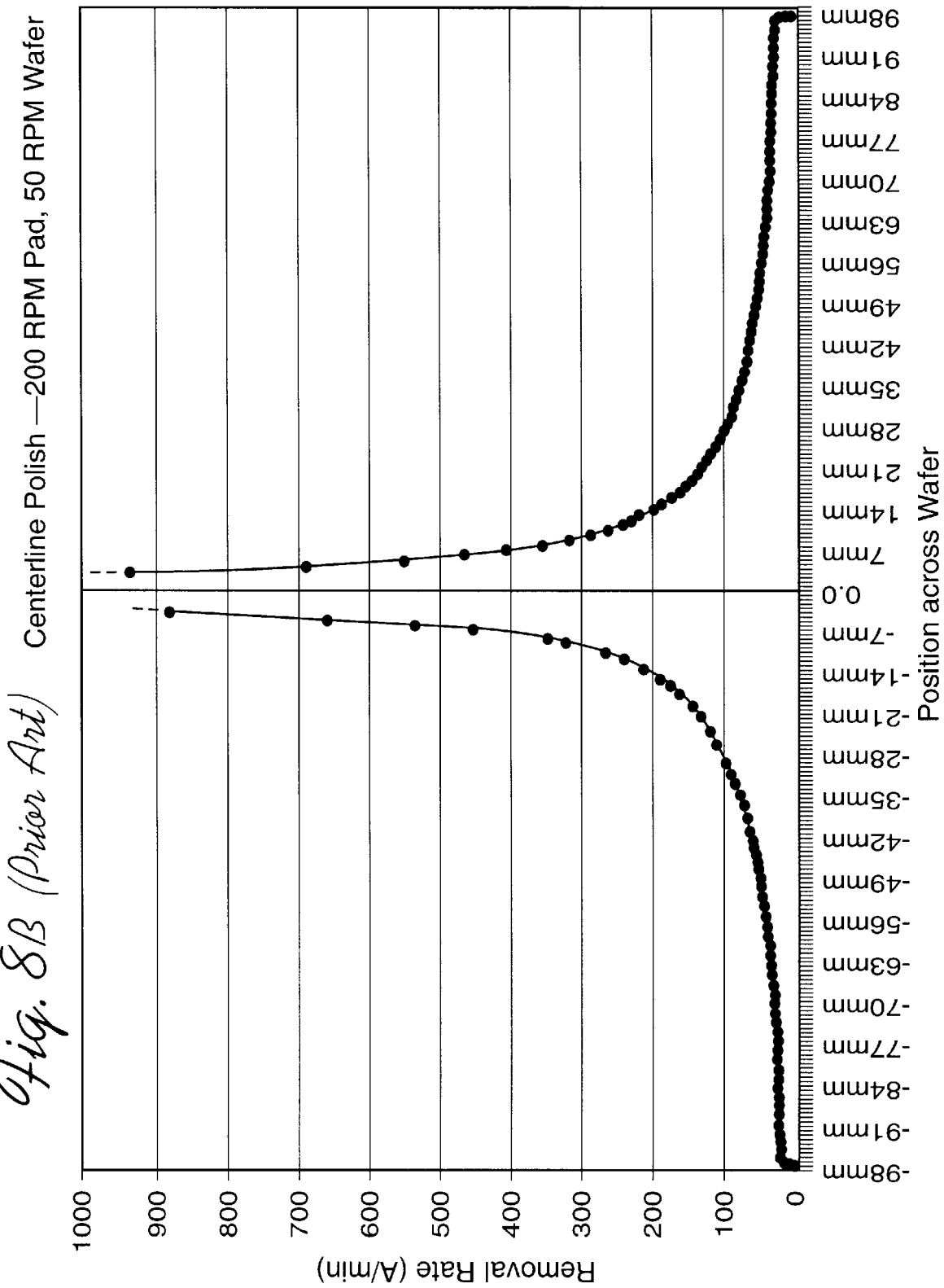

The wafer material removal rate for a particular polishing regime can be readily determined by analyzing test samples. For example, FIGS. 8A and 8B show the rate of wafer material removal (in angstroms per minute or "A/m") as a function of radial position for 200 mm diameter test wafers polished at centerline only in accordance with conventional practice. The test wafers were polished with the apparatus described herein using an abrasive slurry and a pad rotation of 200 RPM. The wafer rotation was varied from 30 RPM (FIG. 8A) to 50 RPM (FIG. 8B). As shown in FIGS. 8A and 8B, the wafer material removal rate undergoes a significant non-linear increase near the center of the wafers (the center portion (approximately −5 to 5 mm) is not plotted for clarity of scale).

Figure 9A:
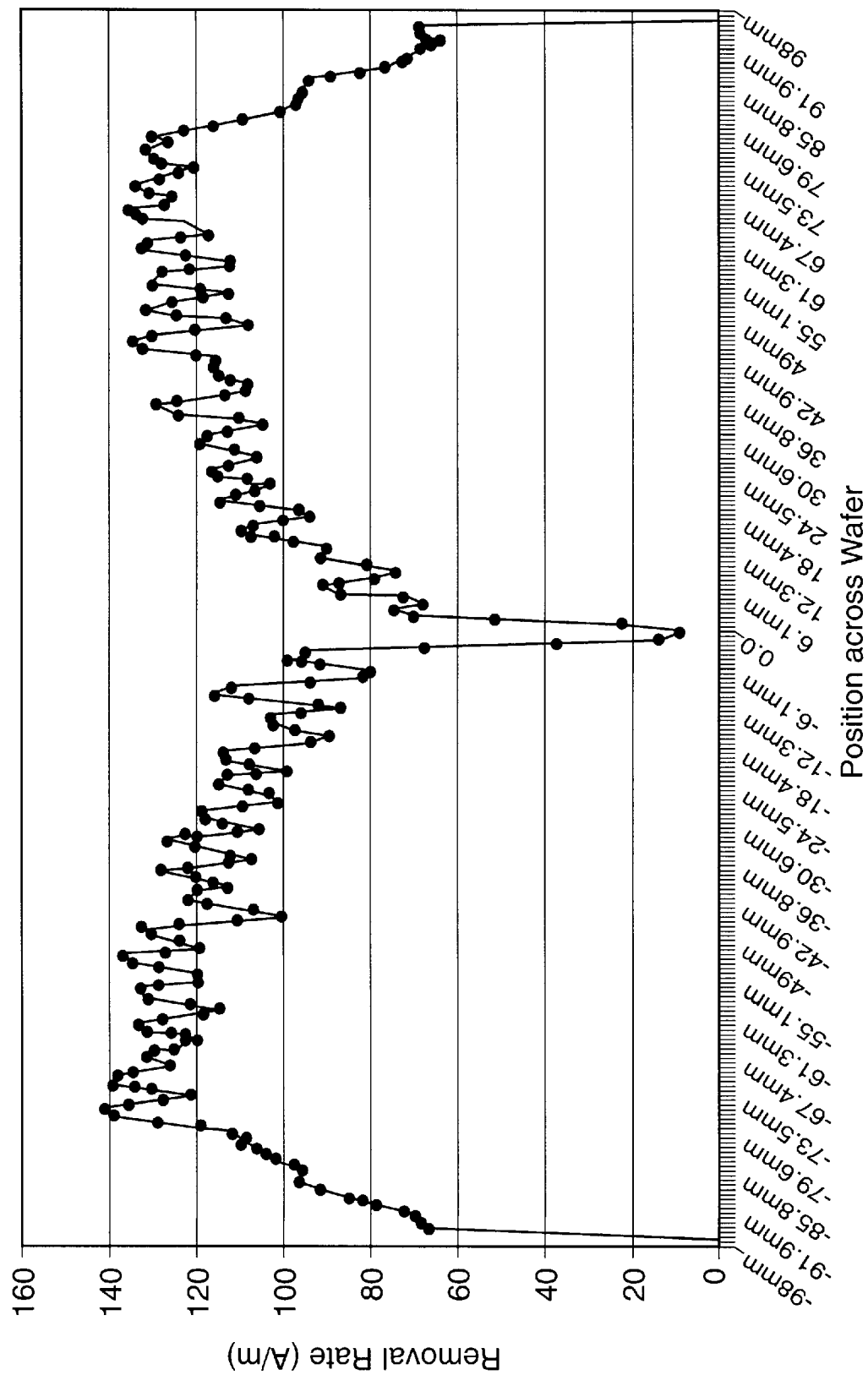
FIGS. 9A and 9B are graphs showing the wafer material removal rate (A/m) versus position across the wafer for test wafers polished using an off-diameter polishing method in accordance with one embodiment of the invention.
Figure 9B:
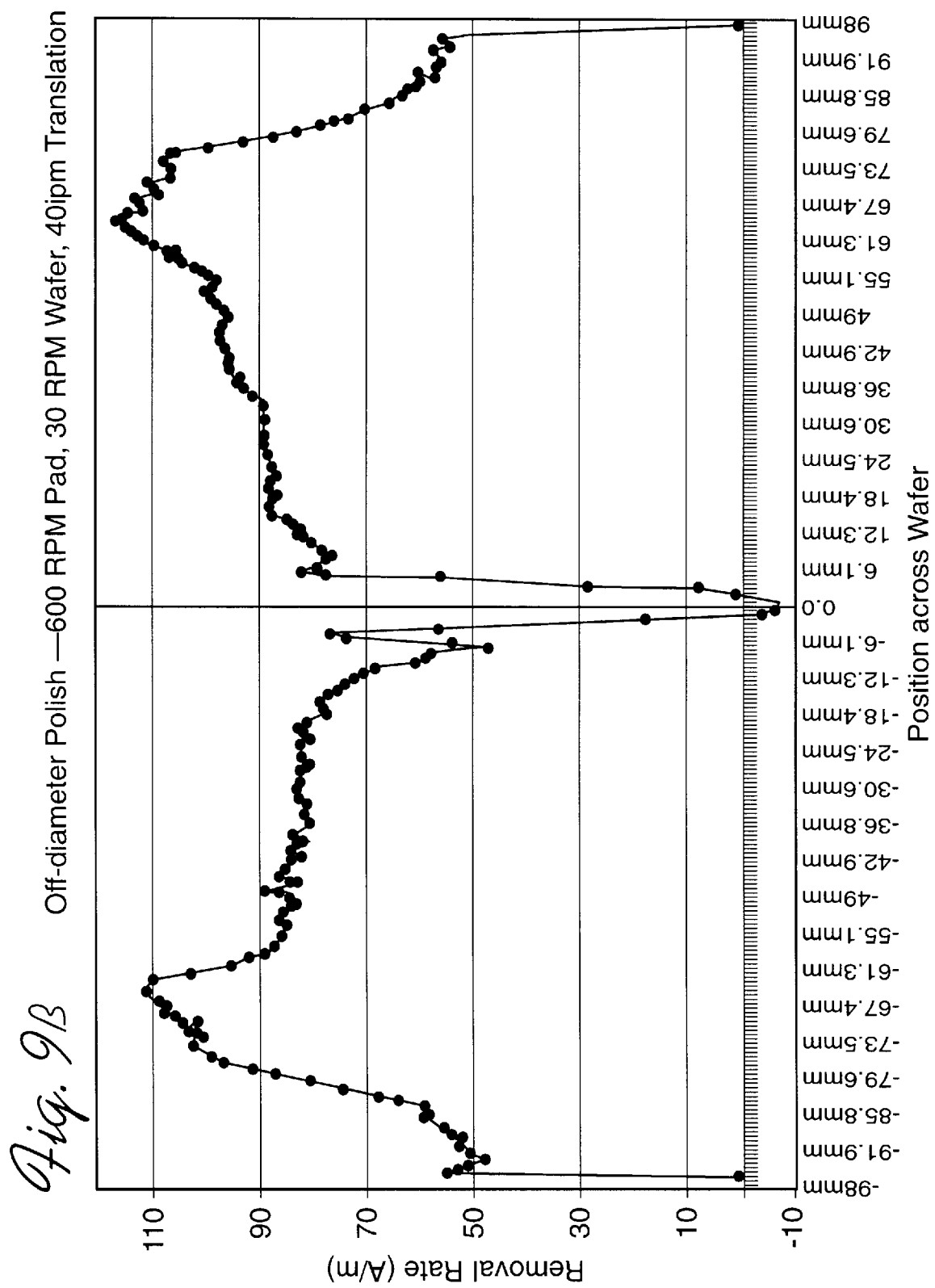

FIGS. 9A and 9B show the rate of wafer material removal (in A/m) as a function of radial position for 200 mm diameter test wafers subjected to off-diameter polishing in accordance with one embodiment of the invention. The test wafers were polished under similar conditions to those described above in connection with the description of FIGS. 8A and 8B, except that the test wafers were moved at a constant rate relative to the polishing pads (excluding the immediate center and edge region). In addition, the pad rotation was 600 RPM (for both test wafers) and the wafer rotation was 30 RPM (for both test wafers). The translation rate (the relative velocity of the wafer to the polishing pads) was varied from 10 inches per minute (ipm) (FIG. 9A) to 40 ipm (FIG. 9B).

The wafer material removal rate obtained using off-diameter polishing is significantly more radially uniform than that obtained using conventional centerline polishing (compare the curves shown in FIGS. 9A and 9B with those shown in FIGS. 8A and 8B). As indicated by the somewhat sloped curves shown in FIGS. 9A and 9B, however, off-diameter polishing causes a slightly higher rate of wafer material removal to occur toward the edge of the wafer. In addition, the faster translation rate, 40 ipm, resulted in a mean wafer material removal rate of about 90 A/m (see FIG. 9B), whereas the slower translation rate, 10 ipm, resulted in a mean wafer material removal rate of about 120 A/m (see FIG. 9A). Thus, the faster translation rate resulted in a slightly lower wafer material rate than the slower translation rate. Nevertheless, given that a four-fold increase in translation rate caused only about a 25% reduction in the wafer material removal rate, it is believed that FIGS. 9A and 9B demonstrate that the translation rate is not a dominant factor in determining the wafer material removal rate. Instead, it is believed that the total amount of wafer material removed at any radial location is predominantly a function of the total polishing exposure or equivalent dwell time.

In one embodiment, the length of the polishing pad is sufficient to span the entire wafer chord at all translation positions so that abrupt discontinuities of pad contact are avoided. Thus, at any specific pad position during translation, the portion of the wafer surface outside the pad line of contact, i.e., the portion farther from the wafer center, is exposed to polishing action. On the other hand, at the same translation position, the portion of the wafer surface inside the pad line of contact, i.e., the portion nearer to the wafer center, is not exposed to polishing action. As shown in FIGS. 6–8, the wafer material removal rate is not necessarily uniform across the pad line of contact.

The off-diameter polishing method may be implemented by formulating a suitable wafer movement, i.e., translation schedule, which is a predetermined schedule of wafer position relative to the polishing pads versus time during a polishing operation. In one embodiment, the off-diameter polishing method is implemented using a wafer movement schedule formulated to obtain substantially the same amount of wafer material removal at each radial location, i.e., radially uniform thickness reduction. In another embodiment, the off-diameter polishing method is implemented using a wafer movement schedule formulated to obtain different amounts of wafer material removal at certain radial locations, i.e., radially variable thickness reduction.

In one embodiment of the off-diameter wafer preparation method of the invention, each of the opposing surfaces of a vertically oriented wafer is contacted with a cylindrical wafer preparation member so as to define a substantially linear contact area. As the wafer is rotated, at least one wafer preparation parameter is controlled to obtain a variable wafer material removal rate as the contact areas on the wafer are moved from a first position to a second position. In one embodiment, the variable wafer material removal rate is formulated to provide the wafer with a substantially uniform thickness after processing. The wafer preparation parameter that is controlled may be one of the pressure applied to the wafer by the wafer preparation member, the rotational speed of the wafer, the rotational speed of the wafer preparation members, and a speed at which the contact areas defined on the opposing surfaces of the wafer are moved from the first position to the second position.

In one embodiment, the first position is the wafer centerline and the second position is a distance from the centerline, e.g., proximate to the edge of the wafer. The wafer may be raised or lowered to move the contact areas from the first position to the second position. In one embodiment, the rate at which the wafer is moved in a vertical direction to move the contact areas from the first position to the second position is controlled such that the wafer has a substantially uniform thickness. By analyzing test wafers to determine the radial variation in wafer material removal rate for a given polishing regime, those skilled in the art can readily formulate a suitable wafer movement schedule to obtain processed wafers having a substantially uniform thickness. Alternatively, the wafer can be moved (either up or down) at a constant rate and one or more of the other polishing parameters, e.g., pressure, wafer rotational speed, and wafer preparation member rotational speed, can be controlled to obtain the same effect. Thus, the off-diameter wafer preparation method may be configured to process wafers having slightly concave or convex surface contours into wafers having substantially planar contours.

Another method provided by the present invention is a method for preparing a semiconductor wafer in which two wafer preparation operations are performed on a vertically oriented wafer in a single enclosure. In this method a pair of wafer preparation assemblies, e.g., wafer preparation assemblies 212 shown in FIG. 11A, are disposed in an opposing relationship in a suitable enclosure, e.g., a housing. Each of the wafer preparation assemblies includes a first wafer preparation member and a second wafer preparation member. By way of example, suitable wafer preparation members include cylindrical polishing pads and cylindrical brushes. After being disposed between the opposing wafer preparation assemblies in a vertical orientation, the wafer is rotated by a suitable wafer drive assembly.

To perform a first wafer preparation operation, the wafer preparation assemblies are oriented such that the first wafer preparation members contact opposing surfaces of the rotating wafer in an opposing relationship. In one embodiment, the wafer preparation assemblies are pivoted in a first direction to bring the first wafer preparation members into contact with the opposing surfaces of the rotating wafer. Once the first wafer preparation operation is done, the wafer preparation assemblies are oriented such that the second wafer preparation members contact opposing surfaces of the rotating wafer in an opposing relationship. In one embodiment, the wafer preparation assemblies are pivoted in a second direction, which is opposite to the first direction, to bring the second wafer preparation members into contact with the opposing surfaces of the rotating wafer.

The wafer preparation assemblies may be configured to perform any desired combination of wafer preparation operations. In one embodiment, the first wafer preparation operation is a cleaning operation and therefore each of the first wafer preparation members is a cylindrical brush. In this embodiment, the second wafer preparation operation is a polishing operation and therefore each of the second wafer preparation members is a cylindrical polishing pad. If desired, the order of these operations may be reversed so that the first operation is a polishing operation and the second operation is a cleaning operation.

In another embodiment, both the first and second wafer preparation operations are cleaning operations. By way of example, the first cleaning operation may be configured to remove relatively coarse particles and the second cleaning operation may be configured to remove relatively fine particles. In yet another embodiment, both the first and second wafer preparation operations are polishing operations. By way of example, the first polishing operation may be configured to remove a desired amount of wafer material and the second polishing operation may be configured to provide a desired surface finish.

If desired, the wafer may be moved in a vertical direction, i.e., up or down, while in contact with either the first wafer preparation members or the second wafer preparation members in accordance with the off-diameter wafer preparation method of the invention. The wafer may be moved in a vertical direction by a suitable variable height edge drive assembly. In one embodiment in which both the first and second wafer preparation operations are polishing operations, the wafer is moved in a vertical direction during at least one of the polishing operations.

Once a wafer is processed in the apparatus and/or prepared using the disclosed methods, the wafer can be processed through other well known fabrication operations. These operations include, as is well known, deposition or sputtering of oxide materials and conductive materials (e.g., aluminum, copper, mixtures of aluminum and copper, and the like). The process, also known as "the backside" process also includes etching operations. These etching operations are designed to define the network of metallization lines, vias, and other geometric patterns necessary to define the interconnect structure of an integrated circuit device. In between these operations, some chemical mechanical polishing (CMP) operations are also needed to planarize the surface to enable more efficient fabrication. After any of such operations, the wafer may need to be buffed/polished and cleaned before proceeding to a next operation in the process of making an integrated circuit device. Once complete, the wafer is cut into dies, each die representing one integrated circuit chip. The chips are then placed into suitable packages and integrated into a desired end device, such as a consumer electronic end product.

In summary, the present invention provides methods and apparatus for polishing, buffing, scrubbing, and rinsing wafers and other suitable substrates. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. An apparatus for preparing a semiconductor wafer, the apparatus comprising:
  a frame member having first and second coaxial shaft assemblies extending therethrough, each of the coaxial shaft assemblies including an inner transfer shaft and a hollow outer pivot shaft, each of the outer pivot shafts having a gear ring affixed thereto, the gear rings intermeshing at an approximate midpoint between the outer pivot shafts;
  a first roller arm having a first end and a second end, the first end being coupled to one end of the hollow outer pivot shaft of the first coaxial shaft assembly and having one end of the inner transfer shaft of the first coaxial shaft assembly disposed therein, the second end having a first drive roller shaft disposed therein, the first drive roller shaft being rotatably coupled to the end of the inner transfer shaft of the first coaxial shaft assembly disposed in the first end of the first roller arm;
  a first wafer drive roller rotatably mounted on the first drive roller shaft, the first wafer drive roller being oriented to rotate a semiconductor wafer in a vertical orientation;
  a second roller arm having a first end and a second end, the first end being coupled to one end of the hollow outer pivot shaft of the second coaxial shaft assembly and having one end of the inner transfer shaft of the second coaxial shaft assembly disposed therein, the second end having a second drive roller shaft disposed therein, the second drive roller shaft being rotatably coupled to the end of the inner transfer shaft of the second coaxial shaft assembly disposed in the first end of the second roller arm;
  a second wafer drive roller rotatably mounted on the second drive roller shaft, the second wafer drive roller being oriented to rotate a semiconductor wafer in a vertical orientation;
  a drive belt for rotating at least one of the inner transfer shafts of the first and second coaxial shaft assemblies; and
  an actuator for controllably moving a lever arm fixed to one of the gear rings, wherein movement of the lever arm causes the first and second roller arms to move from a first position to a second position.

2. The apparatus of claim 1, wherein the first and second wafer drive rollers have a first height with the first and second roller arms in the first position and a second height with the first and second roller arms in the second position.

3. The apparatus of claim 2, wherein the first height is lower than the second height.

4. The apparatus of claim 2, wherein the first height is higher than the second height.

5. The apparatus of claim 1, wherein the actuator is a linear stepper motor.

6. The apparatus of claim 1, wherein the first drive roller shaft has a first roller pulley mounted thereon, the end of the inner transfer shaft of the first coaxial shaft assembly disposed in the first roller arm has a first inner transfer pulley mounted thereon, the second drive roller shaft has a second roller pulley mounted thereon, the end of the inner transfer shaft of the second coaxial shaft assembly disposed in the second roller arm has a second inner transfer pulley mounted thereon, a first transfer belt is disposed on the first roller pulley and the first inner transfer pulley, and a second transfer belt is disposed on the second roller pulley and the second inner transfer pulley.

7. The apparatus of claim 1, wherein the drive belt is a first drive belt for rotating the inner transfer shaft of the first coaxial shaft assembly, and the apparatus further comprises a second drive belt for rotating the inner transfer shaft of the second coaxial shaft assembly.

8. An apparatus for preparing a semiconductor wafer, the apparatus comprising:
  a first wafer drive roller rotatably disposed on a first roller arm, the first wafer drive roller being oriented to rotate a semiconductor wafer in a vertical orientation; and
  a second wafer drive roller rotatably disposed on a second roller arm, the second wafer drive roller being oriented to rotate a semiconductor wafer in a vertical orientation, wherein each of the first and second roller arms is configured to transmit rotational power to the wafer drive roller disposed thereon, each of the first and second roller arms is pivotable between a first position and a second position to adjust a height of the wafer drive roller disposed thereon, and each of the first and second roller arms is coupled to a coaxial shaft assembly having an inner transfer shaft and a hollow outer pivot shaft.

9. The apparatus of claim 8, wherein the first and second roller arms are pivoted by rotating the outer pivot shafts of the first and second coaxial shaft assemblies.

10. The apparatus of claim 8, wherein the inner transfer shafts of the first and second coaxial shaft assemblies are rotated to transmit rotational power to the first and second wafer drive rollers, respectively.

11. An apparatus for preparing a semiconductor wafer, the apparatus comprising:
a wafer drive assembly having a pair of wafer drive rollers for rotating a semiconductor wafer in a vertical orientation, the wafer drive assembly being configured such that the wafer drive rollers are controllably movable from a first position to a second position; and
a pair of wafer preparation assemblies movably disposed in an opposing relationship above the wafer drive assembly, each of the wafer preparation assemblies having a first wafer preparation member and a second wafer preparation member, the wafer preparation assemblies being movable into a first position in which each of the first wafer preparation members is position to perform a first wafer preparation operation on the wafer and into a second position in which each of the second wafer preparation members is positioned to perform a second wafer preparation operation on the wafer.

12. The apparatus of claim 11, wherein the wafer drive rollers have a first height in the first position and a second height in the second position.

13. The apparatus of claim 12, wherein the first height is lower than the second height.

14. The apparatus of claim 12, wherein the first height is higher than the second height.

15. The apparatus of claim 14, wherein each of the wafer preparation assemblies includes a drive assembly for rotating the first and second wafer preparation members.

16. The apparatus of claim 11, wherein the first wafer preparation members are disposed above the second wafer preparation members, each of the first wafer preparation members is a cylindrical brush, each of the second wafer preparation members is a cylindrical polishing pad, and each of the cylindrical polishing pads comprises a mandrel having a polishing pad affixed thereto.

17. The apparatus of claim 11, wherein the first wafer preparation members are disposed above the second wafer preparation members, each of the first and second wafer preparation members is a cylindrical polishing pad, and each of the cylindrical polishing pads comprises a mandrel having a polishing pad affixed thereto.

18. The apparatus of claim 11, wherein the wafer drive assembly and the pair of wafer preparation assemblies are disposed in a housing, and at least one nozzle assembly for delivering fluid is mounted on a wall of the housing.

19. The apparatus of claim 11, further comprising an alignment roller for maintaining alignment of the wafer disposed above the wafer preparation assemblies, the alignment roller being rotatably mounted on an alignment arm.

* * * * *